United States Patent
Mui et al.

(10) Patent No.: US 7,616,506 B2
(45) Date of Patent: *Nov. 10, 2009

(54) SYSTEMS FOR COMPLETE WORD LINE LOOK AHEAD WITH EFFICIENT DATA LATCH ASSIGNMENT IN NON-VOLATILE MEMORY READ OPERATIONS

(75) Inventors: Man Lung Mui, Santa Clara, CA (US); Seungpil Lee, San Ramon, CA (US)

(73) Assignee: SanDisk Corporation, Milpitas, CA (US)

( * ) Notice: Subject to any disclaimer, the term of this patent is extended or adjusted under 35 U.S.C. 154(b) by 382 days.

This patent is subject to a terminal disclaimer.

(21) Appl. No.: 11/617,550

(22) Filed: Dec. 28, 2006

(65) Prior Publication Data

US 2008/0158949 A1    Jul. 3, 2008

(51) Int. Cl.
*G11C 7/10*    (2006.01)
(52) U.S. Cl. .............................. 365/189.05; 365/185.17
(58) Field of Classification Search ............ 365/185.17, 365/189.05
See application file for complete search history.

(56) References Cited

U.S. PATENT DOCUMENTS

| 5,532,962 | A  | 7/1996 | Auclair et al. |
| 5,867,429 | A  | 2/1999 | Chen et al. |
| 6,259,632 | B1 | 7/2001 | Khouri et al. |
| 6,542,407 | B1 | 4/2003 | Chen et al. |
| 6,570,790 | B1 | 5/2003 | Harari |
| 6,594,181 | B1 | 7/2003 | Yamada |

(Continued)

FOREIGN PATENT DOCUMENTS

EP    1271553 A2    1/2003

(Continued)

OTHER PUBLICATIONS

U.S. appl. No. 11/617,554.*

(Continued)

*Primary Examiner*—Hoai V Ho
*Assistant Examiner*—Kretelia Graham
(74) *Attorney, Agent, or Firm*—Vierra Magen Marcus & DeNiro LLP

(57) ABSTRACT

Shifts in the apparent charge stored by a charge storage region such as a floating gate in a non-volatile memory cell can occur because of electrical field coupling based on charge stored by adjacent cells. To account for the shift, compensations are applied when reading. When reading a selected word line, the adjacent word line is read first and the data stored in a set of data latches for each bit line. One latch for each bit line stores an indication that the data is from the adjacent word line. The selected word line is then read with compensations based on the different states of the cells on the adjacent word line. Each sense module uses the data from the adjacent word line to select the results of sensing with the appropriate compensation for its bit line. The data from the adjacent word line is overwritten with data from the selected word line at the appropriate time and the indication updated to reflect that the latches store data from the selected word line. The efficient use of the data latches eliminates the need for separate latches to store data from the adjacent word line.

21 Claims, 21 Drawing Sheets

U.S. PATENT DOCUMENTS

| | | |
|---|---|---|
| 6,643,188 B2 | 11/2003 | Tanaka et al. |
| 6,657,891 B1 | 12/2003 | Shibata et al. |
| 6,717,847 B2 | 4/2004 | Chen |
| 6,741,502 B1 | 5/2004 | Cernea |
| 6,771,536 B2 | 8/2004 | Li et al. |
| 6,785,169 B1 | 8/2004 | Nemati et al. |
| 6,870,766 B2 | 3/2005 | Cho et al. |
| 6,870,768 B2 | 3/2005 | Cernea et al. |
| 6,888,758 B1 | 5/2005 | Hemink et al. |
| 6,956,770 B2 | 10/2005 | Khalid et al. |
| 7,012,835 B2 | 3/2006 | Gonzalez et al. |
| 7,020,017 B2 | 3/2006 | Chen et al. |
| 7,057,939 B2 | 6/2006 | Li et al. |
| 7,099,194 B2 | 8/2006 | Tu et al. |
| 7,177,197 B2 | 2/2007 | Cernea |
| 7,187,585 B2 | 3/2007 | Li et al. |
| 7,196,928 B2 | 3/2007 | Chen |
| 2003/0137888 A1 | 7/2003 | Chen et al. |
| 2004/0057282 A1 | 3/2004 | Cernea |
| 2004/0057285 A1 | 3/2004 | Cernea et al. |
| 2004/0109357 A1 | 6/2004 | Cernea et al. |
| 2004/0213031 A1 | 10/2004 | Hosono et al. |
| 2005/0146931 A1 | 7/2005 | Cernea et al. |
| 2005/0162913 A1 | 7/2005 | Chen |
| 2006/0023502 A1 | 2/2006 | Cernea et al. |
| 2006/0050562 A1 | 3/2006 | Cernea et al. |
| 2006/0158935 A1 | 7/2006 | Chan et al. |
| 2006/0221696 A1 | 10/2006 | Li |
| 2006/0239080 A1 | 10/2006 | Li |
| 2007/0002626 A1 | 1/2007 | Li |
| 2007/0133295 A1 | 6/2007 | Fong |
| 2007/0206426 A1 | 9/2007 | Mokhlesi |

FOREIGN PATENT DOCUMENTS

| | | |
|---|---|---|
| EP | 01329898 A2 | 7/2003 |

OTHER PUBLICATIONS

U.S. Appl. No. 11/617,544, filed Dec. 28, 2006.
U.S. Appl. No. 11/458,997, filed Jul. 20, 2006.
U.S. Appl. No. 11/618,569, filed Dec. 29, 2006.
International Search Report & The Written Opinion of the International Searching Authority, Patent Cooperation Treaty, Application No. PCT/US2007/088779 filed on Dec. 24, 2007, Aug. 5, 2008.
Non-Final Office Action dated Mar. 25, 2009, United States Patent & Trademark Office, U.S. Appl. No. 11/617,544, filed Dec. 28, 2006.

* cited by examiner

| | 502 | 504 | 506 | 508 | 510 | 512 |
|---|---|---|---|---|---|---|
| Read C(E) WLn | | | E | A | B | C |
| | | DL0 | 0 | 1 | 0 | 0 |
| | | DL1 | 0 | 0 | 0 | 1 |
| | | DL2 | 1 | 0 | 0 | 0 |
| | DL0-DL1 = (0,0) & DL2 = 1 If:<br>1. Cell Conductive<br>2. DL2 was 0<br>3. DL0-DL1 were (1,1) | | | | | |
| Read C(A) WLn | | | E | A | B | C |
| | | DL0 | 1 | 0 | 0 | 0 |
| | | DL1 | 1 | 0 | 0 | 1 |
| | | DL2 | 0 | 1 | 0 | 0 |
| | DL0-DL1 = (0,0) & DL2 = 1 If:<br>1. Cell Conductive<br>2. DL2 was 0<br>3. DL0-DL1 were (1,0) | | | | | |
| Read C(B) WLn | | | E | A | B | C |
| | | DL0 | 1 | 1 | 0 | 0 |
| | | DL1 | 1 | 0 | 0 | 1 |
| | | DL2 | 0 | 0 | 1 | 0 |
| | DL0-DL1 = (0,0) & DL2 = 1 If:<br>1. Cell Conductive<br>2. DL2 was 0<br>3. DL0-DL1 were (0,0) | | | | | |
| Read C(C) WLn | | | E | A | B | C |
| | | DL0 | 1 | 1 | 0 | 0 |
| | | DL1 | 1 | 0 | 0 | 0 |
| | | DL2 | 0 | 0 | 0 | 1 |
| | DL0-DL1 = (0,0) & DL2 = 1 If:<br>1. Cell Conductive<br>2. DL2 was 0<br>3. DL0-DL1 were (0,0) | | | | | |
| Remaining Bit Lines where DL=0 | | | E | A | B | C |
| | | DL0 | 0 | 0 | 0 | 0 |
| | | DL1 | 1 | 1 | 1 | 1 |
| | | DL2 | 1 | 1 | 1 | 1 |
| | DL0-DL1 = (0,1) & DL2 = 1 If:<br>1. Cell Non-Conductive<br>2. DL2 was 0 | | | | | |

FIG. 15C

|   | State E | State A | State B | State C |
|---|---|---|---|---|
| (1) Read at Vra | 1 | 0 | 0 | 0 |
| (2) Read at Vrb | 1 | 1 | 0 | 0 |
| (3) (Invert 2) XOR 1 | 1 | 0 | 1 | 1 |
| (4) Read at Vrc | 1 | 1 | 1 | 0 |
| (5) 4 AND 3 | 1 | 0 | 1 | 0 |

SYSTEMS FOR COMPLETE WORD LINE LOOK AHEAD WITH EFFICIENT DATA LATCH ASSIGNMENT IN NON-VOLATILE MEMORY READ OPERATIONS

CROSS-REFERENCE TO RELATED APPLICATIONS

The following application is cross-referenced and incorporated by reference herein in its entirety:

U.S. patent application Ser. No. 11/617,544, entitled "Complete Word Line Look Ahead With Efficient Data Latch Assignment in Non-Volatile Memory Read Operations," by Man Mui, et al., filed on even date herewith.

BACKGROUND OF THE INVENTION

1. Field of the Invention

Embodiments of the present disclosure are directed to non-volatile memory technology.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes multiple transistors arranged in series between two select gates. The transistors in series and the select gates are referred to as a NAND string. FIG. 1 is a top view of one NAND string. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line terminal 26. Select gate 22 connects the NAND string to source line terminal 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and floating gate 12FG. Transistor 14 includes control gate 14CG and floating gate 14FG. Transistor 16 includes control gate 16CG and floating gate 16FG. Control gate 10CG is connected to word line WL3, control gate 12CG is connected to word line WL2, control gate 14CG is connected to word line WL1, and control gate 16CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. A typical architecture for a flash memory system using a NAND structure will include several NAND strings. Relevant examples of NAND-type flash memories and their operation are provided in the following U.S. Patents/Patent Applications, all of which are incorporated herein by reference in their entirety: U.S. Pat. Nos. 5,570,315; 5,774,397; 6,046,935; 5,386,422; 6,456,528; and U.S. patent application Ser. No. 09/893,277 (Publication No. US2003/0002348). Other types of non-volatile memory in addition to NAND flash memory can also be used in accordance with embodiments. Additionally, a non-conductive dielectric material can be used in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95, incorporated by reference herein in its entirety.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. The floating gate charge and threshold voltage of the cell can be indicative of a particular state corresponding to stored data. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

Shifts in the apparent charge stored on a floating gate or other charge storage region can occur because of coupling of an electric field based on the charge stored in neighboring floating gates. This floating gate to floating gate coupling phenomena is described in U.S. Pat. No. 5,867,429, incorporated herein by reference in its entirety. The floating gate to floating gate coupling phenomena occurs most pronouncedly, although not exclusively, between sets of adjacent memory cells that have been programmed at different times. For example, a first memory cell can be programmed to add a level of charge to its floating gate that corresponds to a set of data. Subsequently, one or more adjacent memory cells are programmed to add a level of charge to their floating gates that correspond to a set of data. After one or more of the adjacent memory cells are programmed, the charge level read from the first memory cell may appear to be different than when it was programmed because of the effect of the charge on the adjacent memory cell(s) being coupled to the first memory cell. The coupling from adjacent memory cells can shift the apparent charge level being read from a selected memory cell by a sufficient amount to lead to an erroneous reading of the stored data.

As memory cells continue to shrink in size, the natural programmed and erase distributions of threshold voltages are expected to increase due to short channel effects, greater oxide thickness/coupling ratio variations and more channel dopant fluctuations, reducing the available separation between adjacent states. The reduction of the space between word lines and between bit lines will also increase the coupling between adjacent floating gates. The effect of the floating gate to floating gate coupling is of greater concern for multi-state devices because the allowed threshold voltage ranges and the forbidden ranges (range between two distinct threshold voltage ranges that represent distinct memory states) are narrower than in binary devices. Therefore, floating gate to floating gate coupling can result in memory cells being shifted from an allowed threshold voltage range to a forbidden range. Compensating for the floating coupling during read operations has been proposed. U.S. patent application Ser. No. 11/099,049 describes, among other things, a technique that applies different read reference voltages to a selected word line based on the state of an adjacent memory cell on a neighboring word line. U.S. patent application Ser. No. 11/377,972 describes, among other things, a technique that applies a compensation voltage directly to an adjacent memory cell when reading a selected memory cell to compensate for floating gate coupling from that adjacent memory cell. Both of the above patent applications are incorporated by reference herein in their entirety.

SUMMARY OF THE INVENTION

Shifts in the apparent charge stored by a charge storage region such as a floating gate in a non-volatile storage element can occur because of electrical field coupling based on charge stored by adjacent storage elements. To account for the shift, compensations are applied when reading based on the different possible states to which the adjacent memory cells may have been programmed. When reading a selected word line, the adjacent word line is read first. Data from the memory cells of the adjacent word line is stored in a set of data latches for each bit line. One latch for each bit line stores an indication that the data is from the adjacent word line. The selected word line is then read. Different compensations are applied when reading at the selected word line based on the different possible states of the cells on the adjacent word line. The results of a particular sense operation are individually selected for each bit line based on the appropriate compensation for that bit line. Each bit line sense module uses the data stored in the data latches for the adjacent word line to select the results of the appropriate sense operation. The data from the adjacent word line is overwritten with data from the selected word line in response to the appropriate sense operation. When the data is overwritten, the indication is updated to reflect that the latches for that bit line now store data from the selected word line. An efficient assignment of the data latches is thus provided that minimizes chip space devoted to compensated sensing.

Non-volatile storage is read in one embodiment by reading a second non-volatile storage element in response to a request to read a first non-volatile storage element, storing data read from the second storage element in a set of data latches and storing a first indication that the data in the latches is from the second non-volatile storage element. The first non-volatile storage element is then read. A plurality of sense operations for a particular state are performed to read the first non-volatile storage element. Each sense operation corresponds to different data that may be stored in the latches for the second storage element. The data from the second storage element in the set of data latches is replaced with predetermined data if the first storage element is conductive during a particular one of the sense operations that corresponds to the data stored in the set of data latches from the second non-volatile storage element and the indication that the data is from the second non-volatile storage element is present. The first indication is replaced with a second indication that the predetermined data in the set of data latches is from the first non-volatile storage element if the data from the second storage element is replaced.

Reading non-volatile storage in another embodiment includes storing data from a first set of non-volatile storage elements of a first word line as part of a read operation for a second set of non-volatile storage elements of a second word line. The first set and said second set are in communication with a plurality of bit lines. Storing the data includes storing a set of data for each storage element of the first set in a set of data latches for a corresponding bit line. The second set is read using a plurality of sense operations for a particular state. Each sense operation for the particular state is associated with a potential set of data stored by each of the set of data latches for the storage elements of the first set. For each bit line, it is determined whether a storage element of the second set that is in communication with the bit line is conductive during a particular sense operation that is associated with the data stored in the set of data latches for that bit line. If the storage element of the second set is conductive during that particular sense operation, the set of data for the storage element of the first set is overwritten with predetermined data.

Various embodiments can include non-volatile storage elements and managing circuitry in communication with the storage elements to perform the various described processes. The managing circuitry can include such elements as control circuitry (e.g., including a state machine), row and column decoders, read/write circuits, and/or a controller, for example.

BRIEF DESCRIPTION OF THE DRAWINGS

FIGS. 15A-15C depict a table describing a data latch assignment during a read operation in one embodiment.

DETAILED DESCRIPTION

Memory cells can be used to store data represented in analog or digital form through manipulation of the cell's threshold voltage. The range of possible threshold voltages of a memory cell can be divided into ranges which represent distinct memory states. For example, two ranges of threshold voltages can be used to establish two memory states that are assigned logical data 1 and 0. At least one voltage breakpoint level is generally established so as to partition the threshold voltage memory window of the memory cell into the two ranges. When the cell is read by applying predetermined, fixed voltages (e.g., read reference voltages) to its gate that correspond to the reference threshold voltage level, its source/drain conduction state is established by comparing the conduction current with a breakpoint level or reference current. If the current is higher than the reference current level, the cell is determined to be "on" and in one logical state. If the current is less than the reference current level, the cell is determined to be "off" and in the other logical state. In one example of a NAND-type flash memory, the threshold voltage is negative after the memory cell is erased, and defined as logic 1. The threshold voltage is positive after a program operation, and defined as logic 0. When the threshold voltage is negative and a read is attempted by applying 0V to the control gate, the memory cell will turn on to indicate logic 1 is being stored. When the threshold voltage is positive and a read operation is attempted by applying 0V to the control gate, the memory cell will not turn on to indicate that logic 0 is being stored.

A memory cell can also store multiple bits of digital data by utilizing more than two ranges of threshold voltages to represent distinct memory states. The threshold voltage window can be divided into the number of desired memory states and multiple voltage breakpoint levels used to resolve the individual states. For example, if four states are used, there will be four threshold voltage ranges representing four distinct memory states which are assigned the data values 11, 10, 01, and 00. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Figure 1:
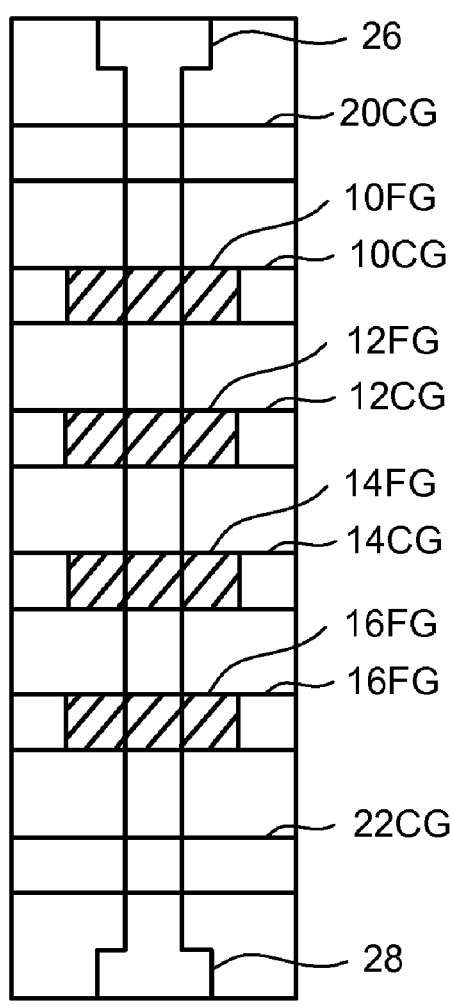
FIG. 1 is a top view of a NAND string.
Figure 2:
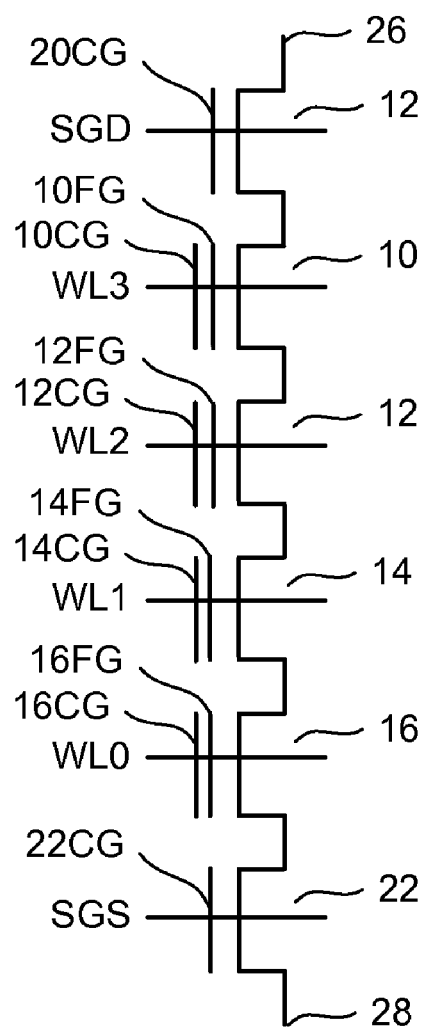
FIG. 2 is an equivalent circuit diagram of the NAND string of FIG. 1.
Figure 3:
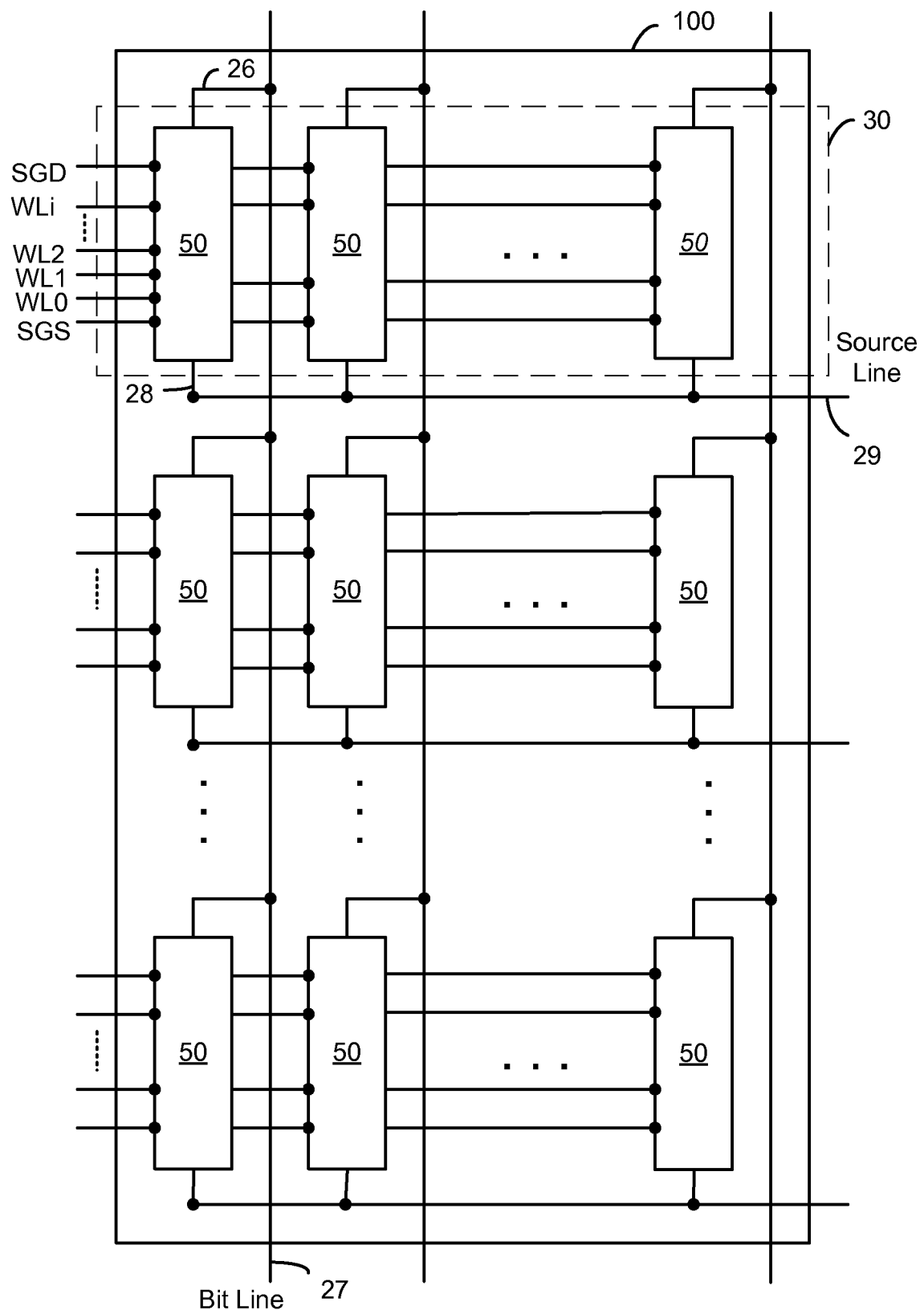
FIG. 3 is a block diagram of an array of NAND flash memory cells.

FIG. 3 illustrates an exemplary array 100 of NAND strings 50, such as those shown in FIGS. 1-2. Along each column, a bit line 27 is coupled to a drain terminal 26 of the bit line select gate for the NAND strings of the column. Along each row of NAND strings, a source line 29 may connect all the source terminals 28 of the source line select gates of a block of NAND strings.

The array 100 of memory cells is divided into a large number of blocks of memory cells. As is common for flash EEPROM systems, the block is the unit of erase and may be referred to as an erase block or physical block. Each block can contain the minimum number of memory cells that are erased together. In FIG. 3, a block such as block 30 includes all the cells connected to a common set of word lines WL0-WLi.

Each block is typically divided into a number of pages. A page is often the minimum unit of programming or reading, although more than one page may be programmed or read in a single operation. The individual pages may be divided into segments combining the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is programmed into the array, and checks the ECC when data is read from the array. Alternatively, the ECCs and/or other overhead data are stored in different pages, or even different blocks, than those of the user data to which they pertain.

A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Each block of memory cells includes a set of bit lines forming columns and a set of word lines forming rows. In one embodiment, the bit lines are divided into odd bit lines and even bit lines. Memory cells along a common word line and connected to the odd bit lines are programmed at one time, while memory cells along a common word line and connected to even bit lines are programmed at another time ("odd/even programming"). In another embodiment, memory cells are programmed along a word line for all bit lines in the block ("all bit line programming"). In other embodiments, the bit lines or block can be broken up into other groupings (e.g., left and right, more than two groupings, etc.).

Figure 4:
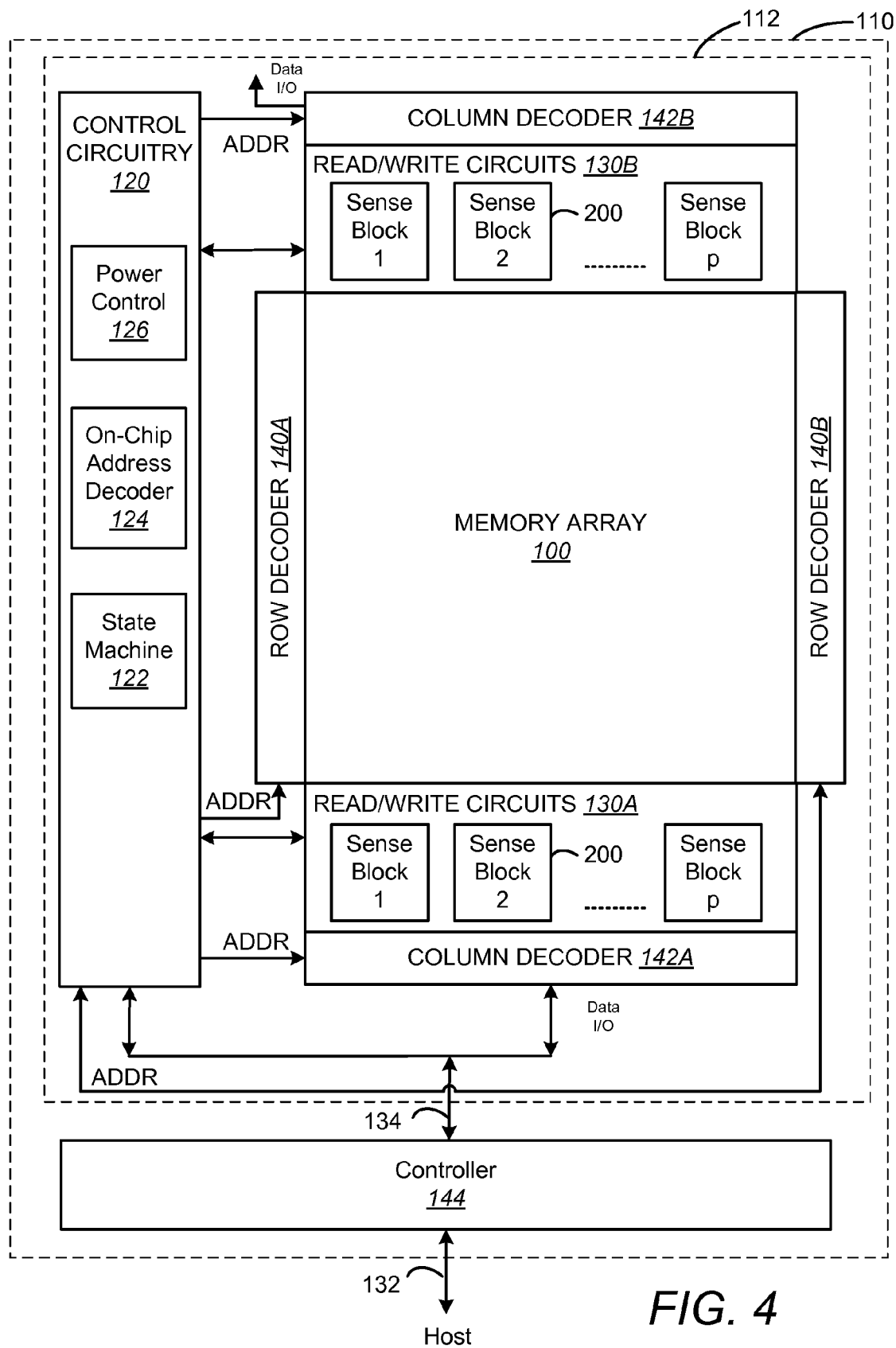
FIG. 4 is a block diagram of a non-volatile memory system.

FIG. 4 illustrates a memory device 110 having read/write circuits for reading and programming a page of memory cells in parallel. Memory device 110 may include one or more memory die or chips 112. Memory die 112 includes a two-dimensional array of memory cells 100, control circuitry 120, and read/write circuits 130A and 130B. In one embodiment, access to the memory array 100 by the various peripheral circuits is implemented in a symmetric fashion, on opposite sides of the array as shown, so that the densities of access lines and circuitry on each side are reduced by half. In other embodiments, the various peripheral circuits may only be included on single sides of the array. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment, a controller 144 is included in the same memory device 110 (e.g., a removable storage card or package) as the one or more memory die 112. Commands and data are transferred between the host and controller 144 via lines 132 and between the controller and the one or more memory die 112 via lines 134.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations.

Figure 5:
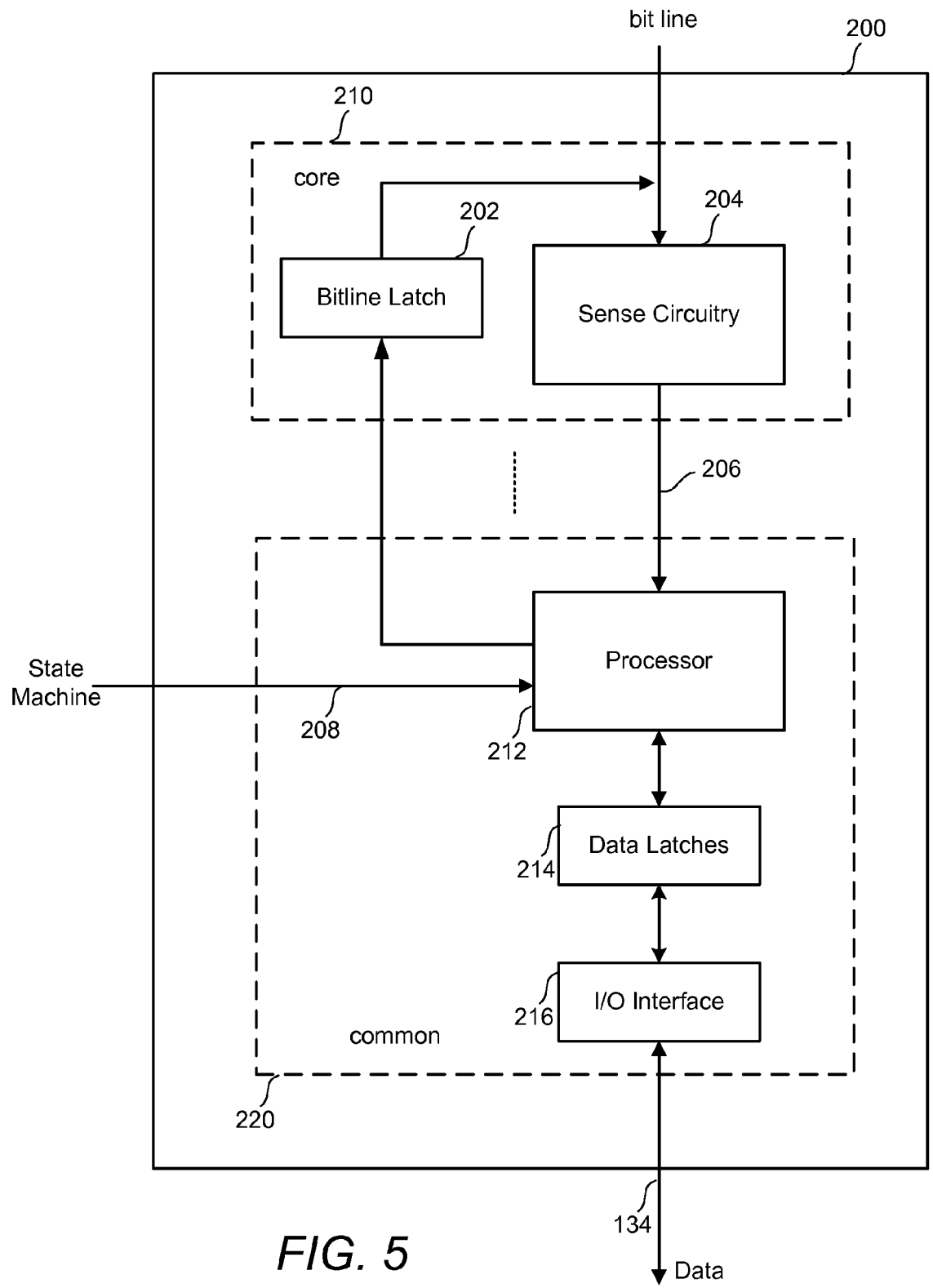
FIG. 5 is a block diagram of one embodiment of a sense block.

FIG. 5 is a block diagram of an individual sense block 200 partitioned into a core portion, referred to as a sense module 210, and a common portion 220. In one embodiment, there will be a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 206. For further details refer to U.S. patent application Ser. No. 11/026,536 "Non-Volatile Memory & Method with Shared Processing for an Aggregate of Sense Amplifiers" filed on Dec. 29, 2004 which is incorporated by reference herein in its entirety.

Sense module 210 comprises sense circuitry 204 that determines whether a conduction current in a connected bit line is above or below a predetermined threshold level. Sense module 210 also includes a bit line latch 202 that is used to set a voltage condition on the connected bit line. For example, a predetermined state latched in bit line latch 202 will result in the connected bit line being pulled to a state designating program inhibit (e.g., Vdd).

Common portion 220 includes a processor 212, a set of data latches 214 and an I/O Interface 216 coupled between the set of data latches 214 and data bus 134. Processor 212 performs computations. For example, one of its functions is to determine the data stored in the sensed memory cell and store the determined data in the set of data latches. The set of data latches 214 is used to store data bits determined by processor 212 during a read operation. It is also used to store data bits imported from the data bus 134 during a program operation. The imported data bits represent write data meant to be programmed into the memory. I/O interface 216 provides an interface between data latches 214 and the data bus 134.

During read or sensing, the operation of the system is under the control of state machine 122 of FIG. 4 that controls the supply of different control gate voltages to the addressed cell via word lines. As it steps through the various predefined control gate voltages corresponding to the various memory states supported by the memory, the sense module 210 will trip at one of these voltages and an output will be provided from sense module 210 to processor 212 via bus 206. At that point, processor 212 determines the resultant memory state by consideration of the tripping event(s) of the sense module and the information about the applied control gate voltage from the state machine via input lines 208. It then computes a binary encoding for the memory state and stores the resultant data bits into data latches 214. In another embodiment of the core portion, bit line latch 202 serves double duty, both as a latch for latching the output of the sense module 210 and also as a bit line latch as described above.

Data latch stack 214 contains a stack of data latches corresponding to the sense module. In one embodiment, there are a set of data latches for every sense module 210 so that every bit line is associated with its own set of latches. In one embodiment supporting two bits of data in each memory cell, there are three data latches for each bit line. Four data latches can be used when the cells store three bits of data, etc. In some implementations (but not required), the data latches are implemented as a shift register so that the parallel data stored therein is converted to serial data for data bus 134, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

In general, memory cells of a page are operated on in parallel. Therefore a corresponding number of sense modules 210 are in operation in parallel. In one embodiment, a page controller (not shown) expediently provides control and timing signals to the sense modules operated in parallel. For more details regarding sense modules 210 and their operation, see U.S. patent application Ser. No. 11\099,133, entitled "Compensating For Coupling During Read Operations Of Non-Volatile Memory," filed Apr. 5, 2005, incorporated by reference in its entirety. Additional information about the structure and/or operations of various embodiments of non-volatile storage devices can be found in: (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099, 133, titled "Compensating for Coupling During Read Operations of Non-Volatile Memory," Inventor Jian Chen, filed on Apr. 5, 2005; and (5) U.S. patent application Ser. No. 11/321, 953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 6:
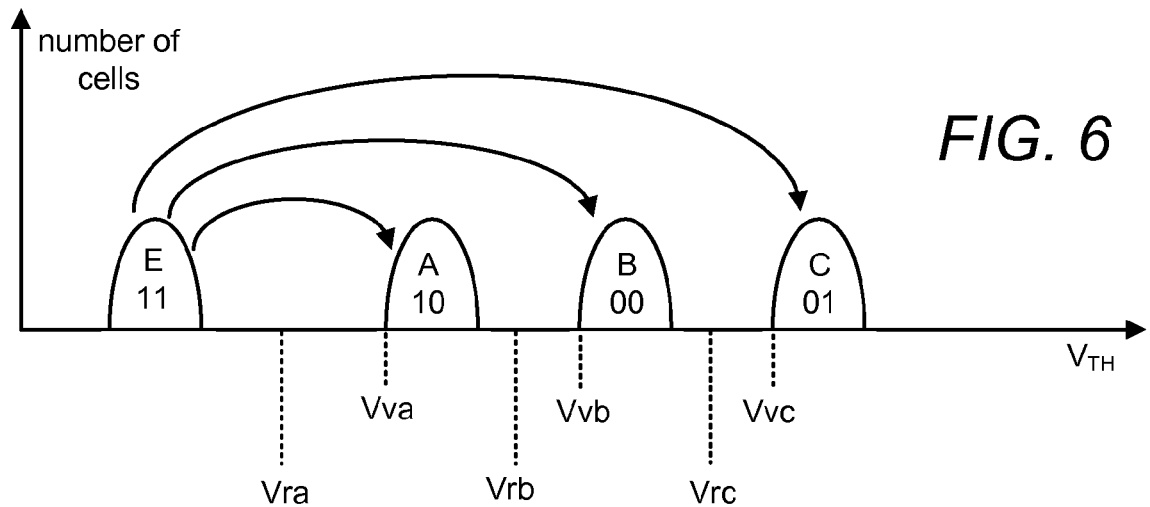
FIG. 6 depicts an exemplary set of threshold voltage distributions and a full sequence programming process.

At the end of a successful program process, the threshold voltages of the memory cells should be within one or more distributions of threshold voltages for programmed memory cells or within a distribution of threshold voltages for erased memory cells, as appropriate. FIG. 6 illustrates threshold voltage distributions for a group of memory cells when each memory cell stores two bits of data. FIG. 6 shows a first threshold voltage distribution E for erased memory cells and three threshold voltage distributions, A, B and C for programmed memory cells. In one embodiment, the threshold voltages in the E distribution are negative and the threshold voltages in the A, B and C distributions are positive.

Each distinct threshold voltage range of FIG. 6 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a gray code assignment so that if the threshold voltage of a floating gate erroneously shifts to its neighboring physical state, only one bit will be affected. However, in other embodiments, gray coding is not used. One example assigns "11" to threshold voltage range E (state E), "10" to threshold voltage range A (state A), "00" to threshold voltage range B (state B) and "01" to threshold voltage range C (state C). Although FIG. 6 shows four states, embodiments in accordance with the present disclosure can also be used with other binary or multi-state structures including those that include more or less than four states.

FIG. 6 shows three read reference voltages, Vra, Vrb and Vrc, for reading data from the memory cells. By testing whether the threshold voltage of a given memory cell is above or below Vra, Vrb and Vrc, the system can determine what state the memory cell is in. If a memory cell conducts with Vra applied to its control gate, then the memory cell is in state E.

If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. FIG. 6 also shows three verify reference voltages, Vva, Vvb and Vvc. When programming memory cells to state A, the system tests whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc. By way of non-limiting example, Vra=0.0V, Vrb =1.35V, Vrc=2.6V, Vva=0.5V, Vvb=1.9V and Vvc=3.3V in one embodiment.

FIG. 6 also depicts a full sequence programming technique. In full sequence programming, memory cells are programmed from the erased state E directly to any of the programmed states A, B or C. A population of memory cells to be programmed may first be erased so that all the memory cells are in erased state E. A series of program voltage pulses is then applied to the control gates of the selected memory cells to program the memory cells directly into states A, B or C. While some memory cells are being programmed from state E to state A, other memory cells are being programmed from state E to state B and/or from state E to state C.

Figure 7:
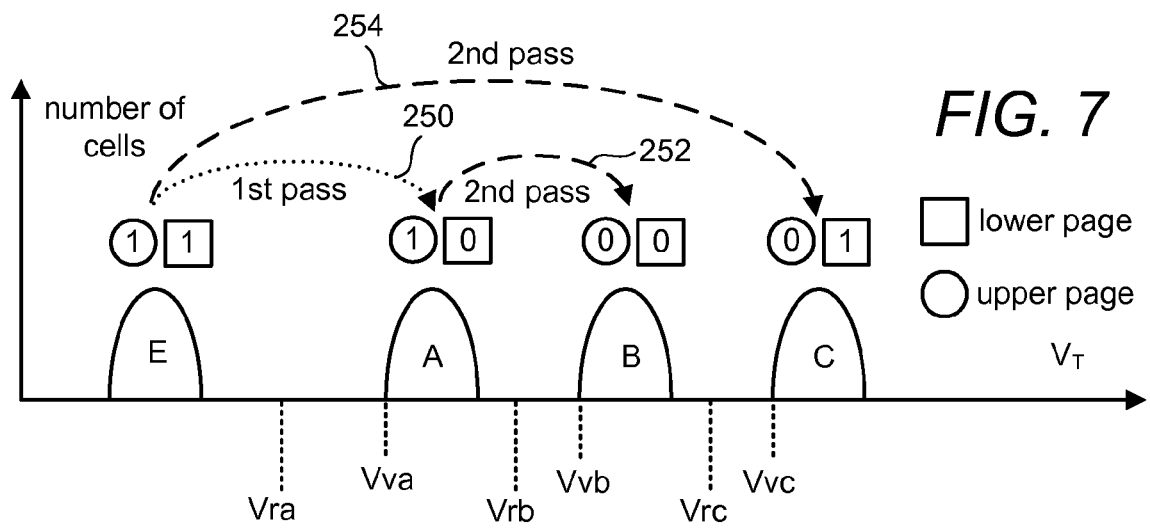
FIG. 7 depicts an exemplary set of threshold voltage distributions and an upper page/lower page programming process.

FIG. 7 illustrates an example of a two-pass technique of programming multi-state memory cells that store data for two different pages: a lower page and an upper page. Four states are depicted. For state E, both pages store a "1." For state A, the lower page stores a 0 and the upper page stores a 1. For state B, both pages store 0. For state C, the lower page stores 1 and the upper page stores 0. Although specific bit patterns have been assigned to each of the states, different bit patterns may be assigned.

In a first programming pass, the cell's threshold voltage level is set according to the bit to be programmed into the lower logical page. If that bit is a logic 1, the threshold voltage is not changed since it is in the appropriate state as a result of having been earlier erased. However, if the bit to be programmed is a logic 0, the threshold level of the cell is increased to be state A, as shown by arrow 250. That concludes the first programming pass.

In a second programming pass, the cell's threshold voltage level is set according to the bit being programmed into the upper logical page. If the upper logical page bit is to store a logic 1, then no programming occurs since the cell is in one of the states E or A, depending upon the programming of the lower page bit, both of which carry an upper page bit of 1. If the upper page bit is to be a logic 0, then the threshold voltage is shifted. If the first pass resulted in the cell remaining in the erased state E, then in the second pass the cell is programmed so that the threshold voltage is increased to be within state C, as depicted by arrow 254. If the cell had been programmed into state A as a result of the first programming pass, then the memory cell is further programmed in the second pass so that the threshold voltage is increased to be within state B, as depicted by arrow 252. The result of the second pass is to program the cell into the state designated to store a logic 0 for the upper page without changing the data for the lower page.

Figure 8A:
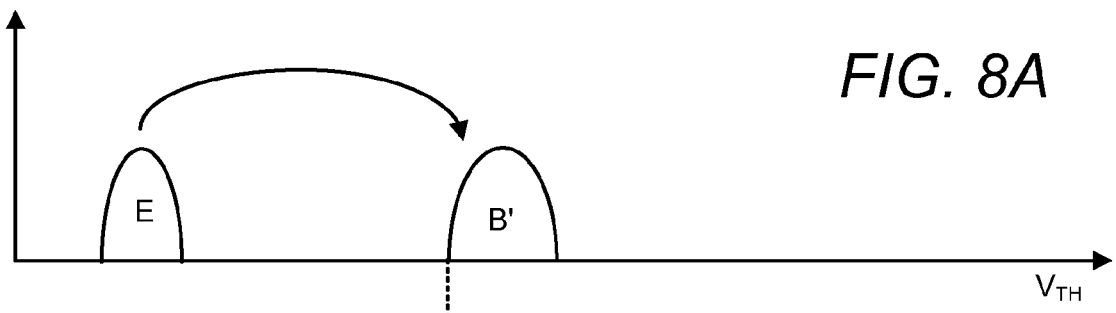
FIGS. 8A-8C depict an exemplary set of threshold voltages and a two-pass programming process.
Figure 8B:
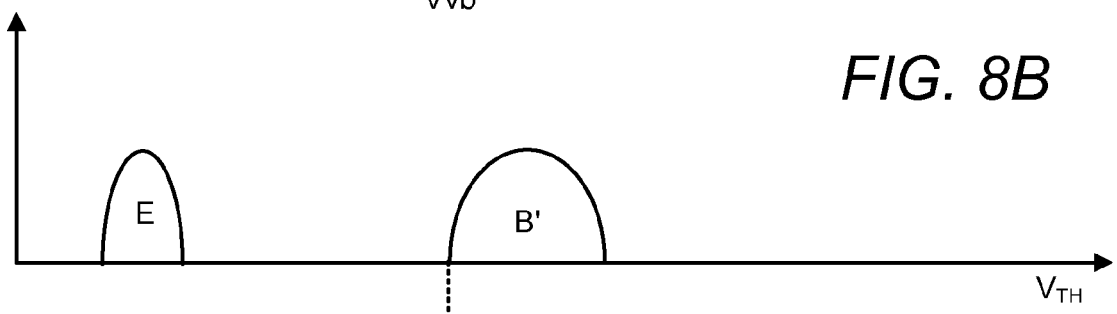
Figure 8C:
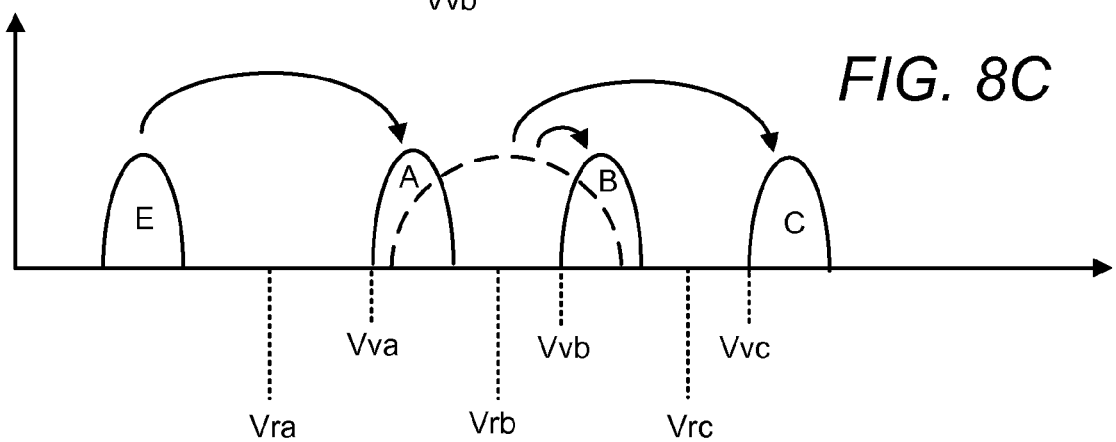

FIGS. 8A-8C disclose a process for programming non-volatile memory that reduces floating gate to floating gate coupling by, for any particular memory cell, writing to that particular memory cell with respect to a particular page subsequent to writing to adjacent memory cells for previous pages. This technique may be referred to herein as last first mode (LM) programming. In the example of FIGS. 8A-8C, each cell stores two bits of data per memory cell, using four data states. Erased state E stores data 11, state A stores data 01, state B stores data 10, and state C stores data 00. Other encodings of data to physical data states can also be used. Each memory cell stores a portion of two logical pages of data. For reference purposes, these pages are called upper page and lower page but can be given other labels. State A is encoded to store bit 0 for the upper page and bit 1 for the lower page, state B is encoded to store bit 1 for the upper page and bit 0 for the lower page, and state C is encoded to store bit 0 for both pages. The lower page data for memory cells at a word line WLn are programmed in a first step depicted in FIG. 8A and upper page data for the cells is programmed in a second step depicted in FIG. 8C. If the lower page data is to remain data 1 for a cell, then the cell's threshold voltage remains at state E during the first step. If the lower page data is to be programmed to 0, then the threshold voltage of the memory cell is raised to state B'. State B' is an interim state B having a verify level Vvb', which is lower than Vvb.

In one embodiment, after the lower page data for the memory cell is programmed, the neighboring memory cells at adjacent word line WLn+1 will be programmed with respect to their lower page. For example, the lower page for memory cells at WL2 in FIGS. 1-3 may be programmed after the lower page for memory cells at WL1. Floating gate coupling may raise the apparent threshold voltage of memory cell 12 if the threshold voltage of memory cell 10 is raised from state E to state B' after programming memory cell 12. The cumulative coupling effect on the memory cells at WLn will widen the apparent threshold voltage distribution of threshold voltages for the cells, as depicted as in FIG. 8B. The apparent widening of the threshold voltage distribution can be remedied when programming the upper page for the word line of interest, as shown in FIG. 8C.

FIG. 8C depicts the process of programming the upper page for the cell at WLn. If a memory cell is in erased state E and its upper page bit is to remain at 1, the memory cell remains in state E. If the memory cell is in state E and its upper page data bit is to be programmed to 0, the threshold voltage of the memory cell is raised to be within the range for state A. If the memory cell was in intermediate threshold voltage distribution B' and its upper page data is to remain 1, the memory cell is programmed to final state B. If the memory cell is in intermediate threshold voltage distribution B' and its upper page data is to become data 0, the threshold voltage of the memory cell is raised to be within the range for state C. The process depicted by FIGS. 8A-8C reduces the effect of floating gate coupling because only the upper page programming of neighbor memory cells will effect the apparent threshold voltage of a given memory cell. An example of an alternate state coding for this technique is to move from intermediate state B' to state C when the upper page data is a 1, and to move to state B when the upper page data is 0. Although FIGS. 8A-8C provide an example with respect to four data states and two pages of data, the concepts can be applied to other implementations with more or less than four states and different numbers of pages.

Figure 9:
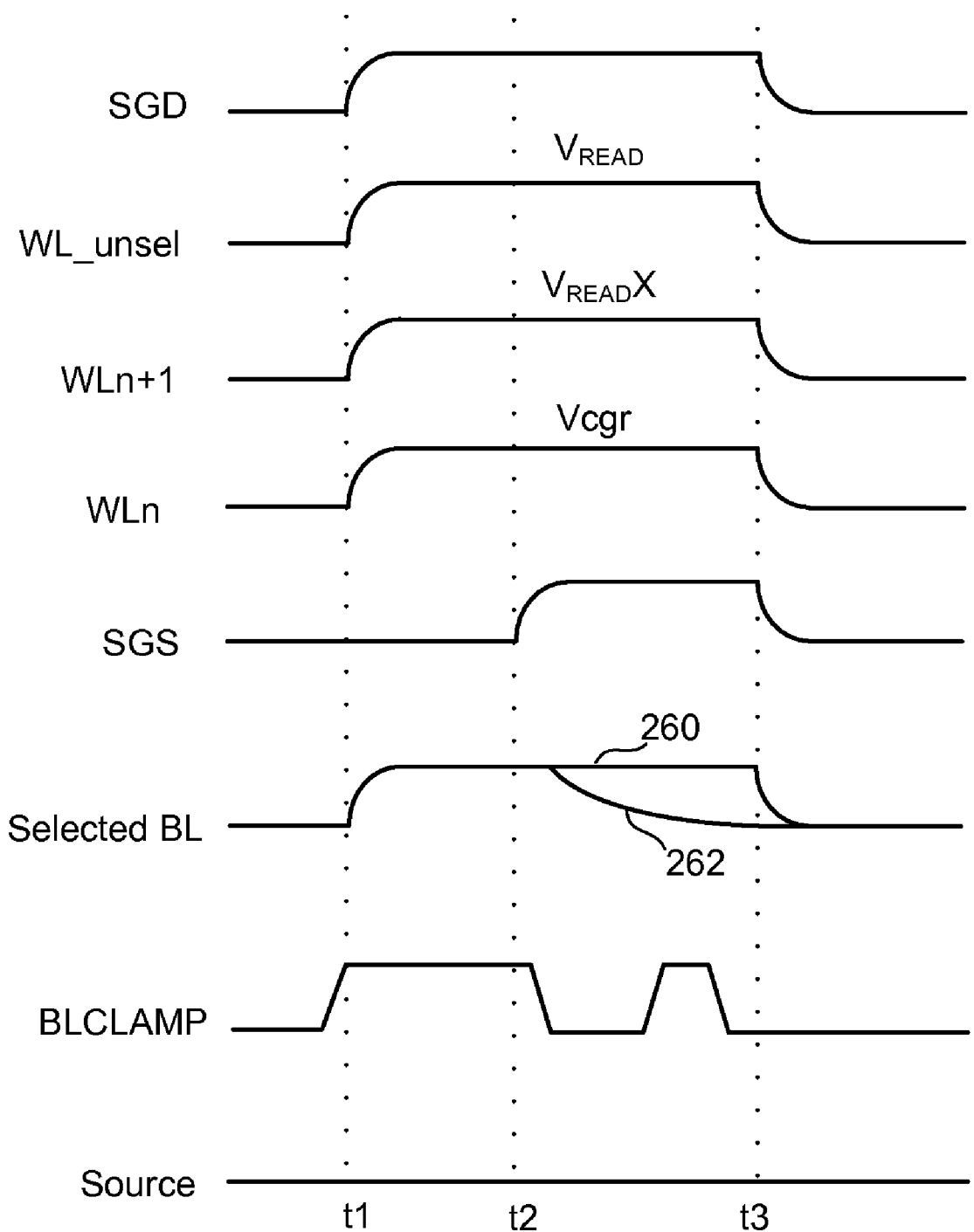
FIG. 9 is a timing diagram that explains the behavior of certain signals during read/verify operations.

FIG. 9 is a timing diagram depicting the behavior of various signals of a non-volatile memory system during one iteration of a read or verify process. Each iteration of the process of FIG. 9 represents a single sense operation for each cell memory. If the memory cells are binary memory cells, the process of FIG. 9 may be performed once. If the memory cells are multi-state memory cells with four states (e.g., E, A, B, and C), the process of FIG. 9 may be performed three times (three sense operations) for each memory cell, etc.

In general, during the read and verify operations, the selected word line is connected to a read reference voltage Vcgr, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a particular value, then it is assumed that the memory cell turned on and the voltage applied to the word line is greater than the threshold voltage of the memory cell. If the conduction current is not measured to be greater than the particular value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not.

FIG. 9 shows signals SGD, WL_unsel. WLn+1, WLn, SGS, Selected BL, BLCLAMP, and Source starting at Vss (approximately 0 volts). SGD is the gate selection line of the drain side select gate. SGS is the gate selection line of the source side select gate. WLn is the word line selected for reading/verification. WLn+1 is the unselected word line that is the drain side neighboring word line to WLn. WL_unsel represents the unselected word lines other than the drain side neighboring word line. Selected BL is the bit line selected for reading/verification. Source is the source line for the memory cells (see FIG. 3). BLCLAMP is an analog signal that sets the value of the bit line when charged from the sense amplifier.

At time t1, SGD is raised to Vdd (e.g., 3.5V), the unselected word lines (WL_unsel) are raised to $V_{READ}$ (e.g., 5.5V), the drain side neighboring word line (WLn+1) is raised to $V_{READ}X$, the selected word line WLn is raised to Vcgr (e.g., Vra, Vrb, or Vrc) for a read operation or a verify level (e.g., Vva, Vvb, or Vvc) for a verify operation, and BLCLAMP is raised to a pre-charging voltage to pre-charge the selected bit line Selected BL (e.g., to approximately 0.7V). The voltages $V_{READ}$ and $V_{READ}X$ act as pass voltages because they cause the unselected memory cells to turn on (regardless of physical state or threshold voltage) and act as pass gates.

At time t2, BLCLAMP is lowered to Vss so the NAND string can control the bit line. Also at time t2, the source side select gate is turned on by raising SGS (B) to Vdd. This provides a path to dissipate the charge on the bit line. If the threshold voltage of the memory cell selected for reading is greater than Vcgr or the verify level applied to the selected word line WLn, then the selected memory cell will not turn on and the bit line will not discharge, as depicted by signal line 260. If the threshold voltage in the memory cell selected for reading is below Vcgr or below the verify level applied to the selected word line WLn, then the memory cell selected for reading will turn on (conduct) and the bit line voltage will dissipate, as depicted by curve 262.

At some point after time t2 and prior to time t3 (as determined by the particular implementation), the sense amplifier will determine whether the bit line has dissipated a sufficient amount. In between t2 and t3, BLCLAMP is raised to let the sense amplifier measure the evaluated BL voltage and then lowered. At time t3, the depicted signals will be lowered to Vss (or another value for standby or recovery). Note that in other embodiments, the timing of some of the signals can be changed (e.g. shift the signal applied to the neighbor). For further details, including an explanation of measuring a cell's conduction current by the rate it discharges a dedicated capacitor in the sense amplifier, see U.S. patent application Ser. No. 11/377,972, entitled "System for Performing Read Operation on Non-Volatile Storage with Compensation for Coupling," by Nima Mokhlesi, incorporated by reference herein in its entirety.

As earlier described, floating gate coupling can cause errors during read operations. The charge stored on the floating gate of a memory cell can undergo an apparent shift because of electrical field coupling associated with charge stored at a neighboring memory cell's floating gate or other charge storage region (e.g., dielectric charge storage region). While in theory the electric field from a charge on the floating gate of any memory cell in a memory array can couple to the floating gate of any other memory cell in the array, the effect is most pronounced and noticeable with adjacent memory cells. Adjacent memory cells may include neighboring memory cells that are on the same bit line, neighboring memory cells on the same word line, or neighboring memory cells that are on both a neighboring bit line and neighboring word line, and thus, adjacent from each other in a diagonal direction. The apparent shift in charge can result in errors when reading the memory state of a memory cell.

The effects of floating gate coupling are most pronounced in situations where a memory cell adjacent a target memory cell is programmed subsequent to the target memory cell, although its effects may be seen in other situations as well. A charge placed on the floating gage of an adjacent memory cell, or a portion of the charge, will effectively be coupled to the target memory cell through electrical field coupling, resulting in an apparent shift of the threshold voltage of the target memory cell. A memory cell's apparent threshold voltage can be shifted to such a degree after being programmed that it will not turn on and off (conduct) under the applied read reference voltages as expected for a memory cell in the memory state to which it was intended to be programmed.

Typically, rows of memory cells are programmed starting with the word line (WL0) adjacent to the source side select gate line. Programming proceeds sequentially thereafter by word line (WL1, WL2, WL3, etc.) through the strings of cells such that at least one page of data is programmed in an adjacent word line (WLn+1) after completing programming (placing each cell of the word line into its final state) of the preceding word line (WLn). This pattern of programming results in an apparent shift of the threshold voltage of memory cells after being programmed due to floating gate coupling. For every word line except the last word line of a NAND string to be programmed, an adjacent word line is programmed subsequent to completing programming of the word line of interest. The negative charge added to the floating gates of memory cells on the adjacent, later programmed word line raises the apparent threshold voltage of the memory cells on the word line of interest. Programming can also begin with the word line adjacent to the drain side select gate and proceed sequentially toward the source side select gate. In this case, the floating gate coupling can similarly effect the apparent threshold voltage of memory cells.

Figure 10:
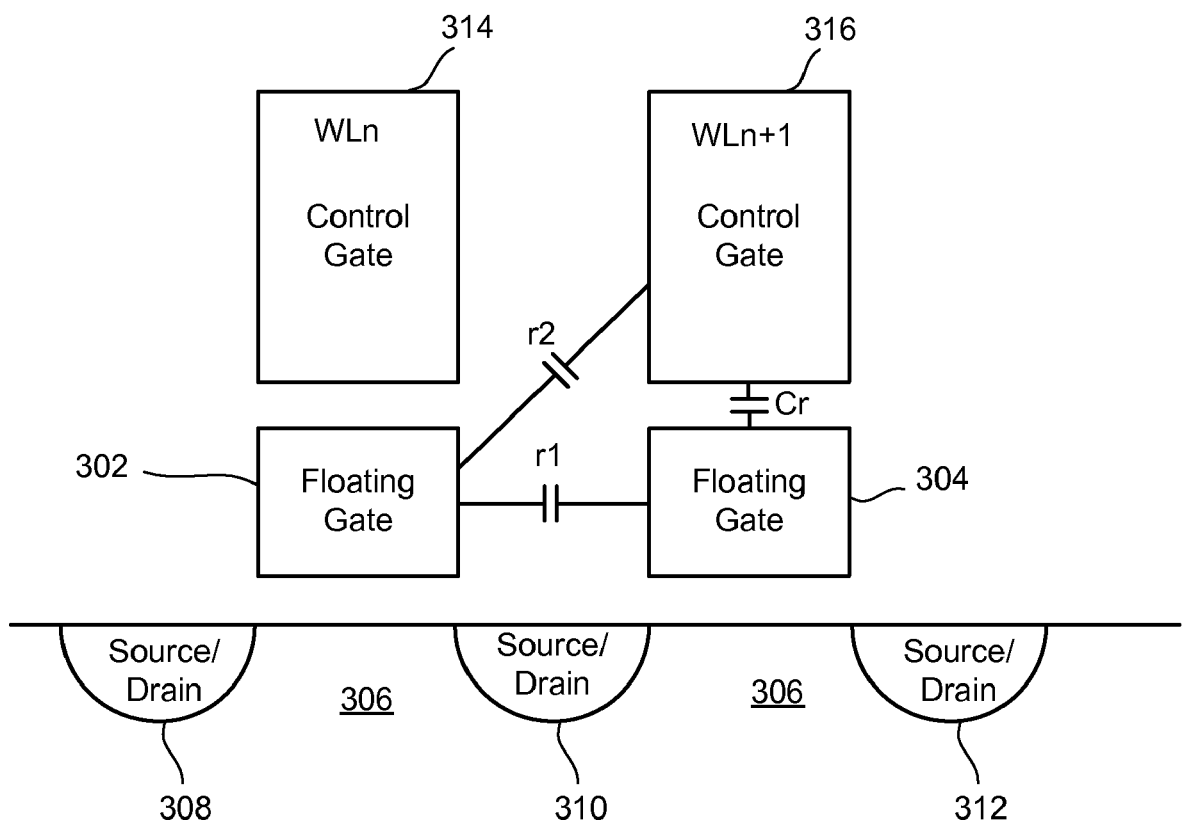
FIG. 10 is a block diagram illustrating capacitive coupling between two neighboring memory cells.

FIG. 10 graphically explains the concept of floating gate coupling. FIG. 10 depicts neighboring floating gates 302 and 304, which are on the same NAND string. Floating gates 302 and 304 are situated above NAND channel/substrate 306, which has source/drain regions 308, 300 and 312. Above floating gate 302 is control gate 314 that is connected to word line WLn. Above floating gate 304 is control gate 316 that is connected to word line WLn+1. In some cases, the control gates form the word lines while in others, the word lines are formed separately and then connected to the control gates. Although floating gate 302 will likely be subject to coupling from multiple other floating gates, for simplicity FIG. 10 only shows the effects from one neighboring memory cell. FIG. 10 shows three components of coupling provided to floating gate 302 from its neighbor: r1, r2 and Cr. The component r1 is the coupling ratio between the neighboring floating gates (302 and 304), and is calculated as the capacitance of the neighboring floating gates divided by the sum of all capacitive couplings of floating gate 302 to all the other electrodes surrounding it. The component r2 is the coupling ratio between the floating gate 302 and the drain side neighbor control gate 316, and is calculated as the capacitance of floating gate 302 and control gate 316 divided by the sum of all capacitive couplings of floating gate 302 to all the other electrodes surrounding it. The component Cr is the control gate coupling ratio and is calculated as the capacitance between floating gate 304 and its corresponding control gate 316 divided by the sum of all capacitive couplings of floating gate 302 to all the other electrodes surrounding it.

Figure 11:
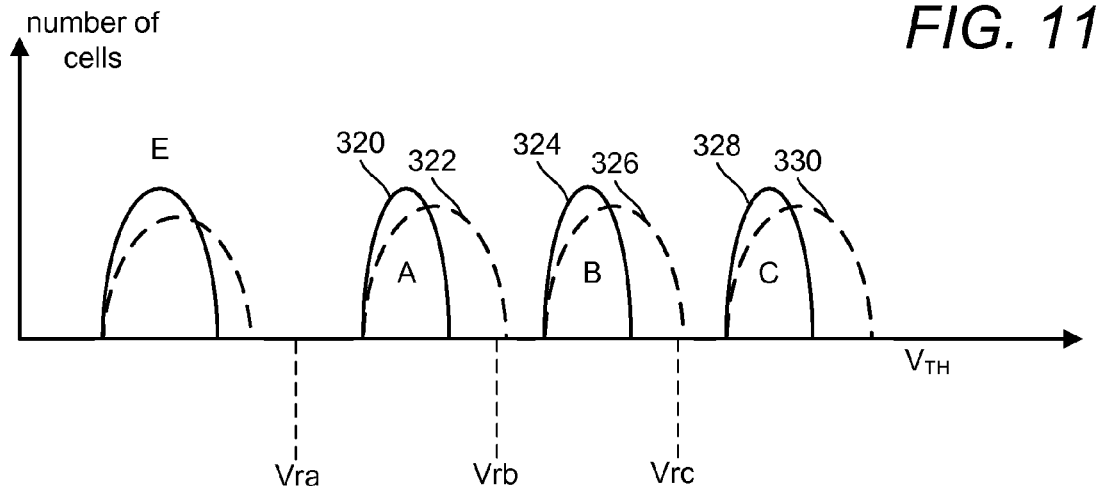
FIG. 11 is an exemplary set of threshold voltage distributions illustrating the effects of floating gate coupling.

FIG. 11 shows the apparent threshold voltage distributions for a row of memory cells (e.g., WLn) before (solid curves) and after (dotted curves) its adjacent row (WLn+1) is programmed. Each distribution is widened as a result of adding negative charge to the floating gates of the memory cells of the adjacent word line. Because of floating gate coupling, the negative charge of a later programmed memory cell on WLn+1 will raise the apparent threshold voltage of a memory cell on WLn that is connected to the same bit line. Distributions 320 and 322 represent the cells of a selected word line WLn in state A before and after programming the adjacent word line WLn+1, respectively. Distributions 324 and 326 represent the cells of WLn in state B before and after programming WLn+1, respectively. Distributions 328 and 330 represent the cells of WLn in state C after programming WLn+1, respectively. Because the distributions are widened, memory cells may be read incorrectly as in an adjacent state. Memory cells at the upper end of each distribution can have an apparent threshold voltage above a corresponding read compare point. For example, when applying reference voltage Vrb, certain memory cells programmed to state A may not conduct sufficiently because of the shift in their apparent threshold voltage. These cells may incorrectly be read as in state B, causing read errors. The later programmed cells can also effect the apparent threshold voltage of memory cells of WLn that are connected to different bit lines, such as those connected to adjacent bit lines.

Figure 12:
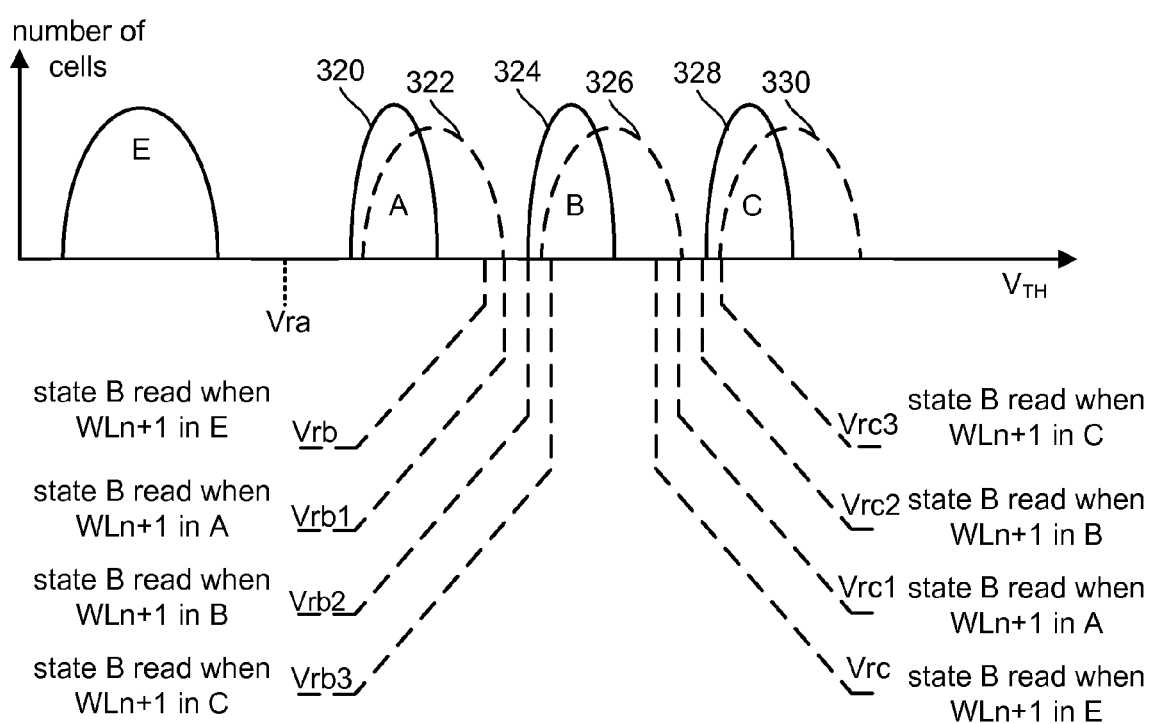
FIG. 12 is an exemplary set of threshold voltage distributions illustrating a technique for compensating for floating gate coupling that can be used in accordance with one embodiment.

FIG. 12 graphically depicts a reading technique that can be used to address some of the apparent shifts in threshold voltage illustrated in FIG. 11. When reading data on word line WLn, the data of word line WLn+1 can also be read and if the data on word line WLn+1 has disturbed the data on WLn, the read process for WLn can compensate for that disturb. State or charge level information for the memory cells at word line WLn+1 can be determined in order to select appropriate read reference voltages for reading individual memory cells of word line WLn.

Individual read reference voltages for reading WLn based on the state of an adjacent memory cell at word line WLn+1 are depicted. In general, different offsets (e.g., 0V, 0.1V, 0.2V, 0.3V) to the regular read reference voltages Vra, Vrb, and Vrc are used. The results of sensing at the different offsets are selected as a function of the state of a memory cell on a neighboring word line. The memory cells at word line WLn are sensed using each of the different read reference voltages including the different offsets. For a given memory cell, the results from sensing at an appropriate one of the read reference voltages can be selected based upon the state of an adjacent memory cell at word line WLn+1.

When reading word line WLn+1, the read reference voltages Vra, Vrb, and Vrc can be used. In other embodiments, different read reference voltages may be applied at WLn+1. In some embodiments, the read operation for WLn+1 determines the actual data stored at WLn+1. In other embodiments, the read operation for WLn+1 only determines the charge levels of these cells, which may or may not accurately reflect the data stored at WLn+1. In some embodiments, the levels and/or the number of levels used to read WLn+1 may not be exactly the same as those used to read WLn. Some approximation of the floating gate threshold value can be sufficient for WLn correction purposes in some implementations. In one embodiment, the results of reading at WLn+1 can be stored in latches 214 at each bit line to be used when reading WLn.

The word line of interest WLn is read at the regular read reference voltage levels Vra, Vrb, and Vrc which do not compensate for any coupling effects. The results of reading at the regular reference levels are stored in the latches for bit lines with memory cells where the neighboring cell at WLn+1 was determined to be in state E. For other bit lines, the data is disregarded. Another read operation is performed at word line WLn using a first set of offsets to the read reference voltages. For example, the read process can use Vra1 (Vra+0.1V), Vrb1 (Vrb+0.1V) and Vrc1 (Vrc+0.1V). The results from using these reference values are stored for bit lines with memory cells having neighboring memory cells at WLn+1 in state A. Data for other bit lines is disregarded. Word line WLn is read again with a second set of offsets using read reference levels Vra2 (Vra+0.2V), Vrb2 (Vrb+0.2V) and Vrc2 (Vrc+0.2V). The results are stored in latches for bit lines with memory cells having adjacent cells at WLn+1 in state B. Data for other bit lines is disregarded. A final read is performed for word line WLn with a third set of offsets using reference levels Vra3 (Vra+0.3V), Vrb3 (Vrb+0.3V) and Vrc3 (Vrc+0.3V). The results are stored for those bit lines having memory cells with neighboring cells at WLn+1 in state C. In some embodiments, no offsets will be used at Vra because of the larger natural margin between state E and state A. Such an embodiment is depicted in FIG. 12 where a single read reference voltage Vra is depicted at the state A level. Other embodiments may use offsets for this level as well. The process of FIG. 12 can be used for recovering data or as an initial read process.

The different offsets to the regular read reference voltages can be selected as a function of the state of a memory cell on the adjacent word line. For example, a set of offset values could include a 0V offset corresponding to an adjacent cell in state E, a 0.1V offset corresponding to an adjacent cell in state A, a 0.2V offset corresponding to an adjacent cell in state B, and a 0.3V offset corresponding to an adjacent cell in state C. The offset values will vary according to implementation. In one embodiment, the offset values are equal to the amount of shift in apparent threshold voltage that results from an adjacent cell being programmed to a corresponding state. For example, 0.3V may represent the shift in apparent threshold voltage for a cell at WLn when an adjacent cell at WLn+1 is programmed to state C after programming WLn. The offset values need not be the same for every reference voltage level. For example, the offset values for the Vrb reference voltage may be 0V, 0.1V, 0.2V, and 0.3V while those for the Vrc reference voltage may be 0V, 0.15V, 0.25V and 0.35V. Additionally, the increment in offsets need not be the same for every state. For example, a set of offsets in one embodiment could include 0V, 0.1V, 0.3V, and 0.4V for adjacent cells in states E, A, B, and C, respectively.

Another technique used to compensate for floating gate coupling provides compensation to a memory cell adjacent a selected memory cell in order to reduce the coupling effect that the adjacent memory cell has on the selected memory cell. One such embodiment includes setting up, during the verification process, the required conditions for later application of compensation to the adjacent memory cell. In such an embodiment the pass voltage, otherwise known as $V_{READ}$, applied to WLn+1 is reduced from a typical value of, for example, 6V that is applied to each other unselected word line down to, for example, 3V. The compensation consists of application of a higher voltage, as compared to the voltage used during the verify phase of program/verify operations, to WLn+1 during the read operation performed on WLn. The compensation can include a change/delta: $\Delta V_{READ} = \{[V_{READ}(\text{WLn+1 during read of WLn})] - [V_{READ}(\text{WLn+1 during verify of WLn})]\}$. The advantage of using a lower $V_{READ}$ value during verify is that it allows the application of reasonable values of $V_{READ}$ later during read operations, while maintaining the required $\Delta V_{READ}$. Had it not been for the use of a smaller than normal value of $V_{READ}$ during verify, the necessary value of $V_{READ}$ during READ that would allow the application of sufficient $\Delta V_{READ}$ would have been, for example, 6+3=9V which would have been a large voltage that could lead to read disturb conditions. One example of such setting up for later compensation is depicted in FIG. 9 as the application of $V_{READ}X$ to the drain side neighboring word line while the other unselected word lines receive $V_{READ}$. Typically, all of the unselected word lines would receive $V_{READ}$. In the embodiment of FIG. 9, all of the unselected word lines, except for the drain side neighbor, receive $V_{READ}$, while the drain side neighbor receives $V_{READ}X$.

For the verify process where memory cells are programmed from the source side to the drain side, it is guaranteed (in one embodiment) that when writing to word line WLn, all memory cells on word lines WLn+1 are in the erased state (e.g., state E) (Note: This is true for full sequence and not for LM mode. Please see above explanation). Word line WLn+1 will receive a voltage level $V_{READ}X$, where $V_{READ}X = V_{READ}LA(E)$ (discussed below). In one embodiment, $V_{READ}LA(E)$ is equal to 3.7V. In another embodiment, $V_{READ}X = V_{READ}$. In other embodiments, other values can also be used. In different implementations, different values of $V_{READ}LA(E)$ or $V_{READ}X$ can be determined based on device characterization, experimentation and/or simulation.

In one embodiment, the amount of required compensation, $\Delta V_{READ}$, can be calculated as follows:

$$\Delta Vread = (\Delta VTn + 1)\frac{1}{1 + \frac{r2}{(r1)(Cr)}}$$

Where $\Delta VTn+1$ is the change in threshold voltage of the drain side neighbor memory cell between the time of program/verify of WLn and the present time. $\Delta VTn+1$, and r1 are the root causes of the word line to word line parasitic coupling effect that is mitigated by this method. $\Delta V_{READ}$ is the compensation that is brought to bear in order to combat this effect.

Figure 13:
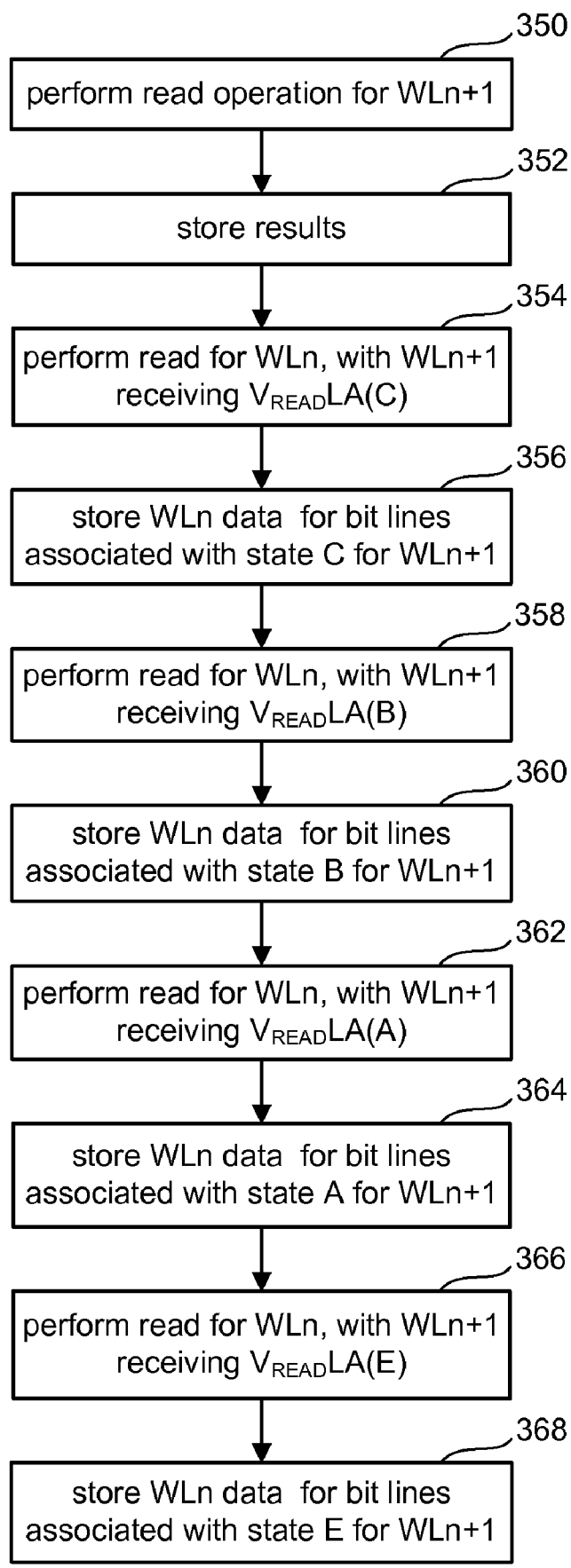
FIG. 13 is a flowchart illustrating a technique for compensating for floating gate coupling that can be used in accordance with one embodiment.

FIG. 13 is a flow chart describing one implementation of such a compensation technique. The process depicted in FIG. 13 applies to full sequence programming as described above with respect to FIG. 6 in which two bits of one logical page are stored in each cell and will be read and reported out together. FIG. 13 could also be used to read both pages of data stored according to the technique of FIG. 7 or FIGS. 8A-8C. A read operation for the neighboring word line WLn+1 is performed at step 350. This can include applying the regular read reference voltages Vra, Vrb, and Vrc to the neighboring word line. Other embodiments may use different reference voltages when reading WLn+1. The data stored in each cell at WLn+1 is determined using the results of sensing at the different levels. The results are stored at step 352.

At step 354, a read process is performed for the word line of interest WLn. This can include performing the process of FIG. 9 with $V_{READ}X = V_{READ}LA(C)$ (FIG. 9). In one embodiment, $V_{READ}LA(C) = V_{READ}$. Thus, all of the unselected word lines (see WL_unsel and WLn+1 of FIG. 9) receive $V_{READ}$. This provides the maximum compensation as the compensation is determined by the difference between the $V_{READ}$ value used on WLn+1 now during read operations and the $V_{READ}$ value used earlier during the verify phase of program/verify. The compensation value, compC, can be defined as follows: $compC = V_{READ}LA(C) - V_{READ}p = 5.5 - 3 = 2.5V$, where $V_{READ}p$ is the $V_{READ}$ value used during program/verify. The results of step 354 are stored at step 356 in data latches for bit lines with memory cells where the adjacent cell at WLn+1 was determined (at step 350) to be in state C. Therefore, the maximum compensation, CompC, is engaged for cells whose drain side neighbors had experienced the highest change in threshold voltage by being programmed from state E to state C. Note that these drain side neighbors were in State E during program/verify of WLn, but now are in state C. What has to be compensated for under all circumstances is the change in state of the drain side neighbor on WLn+1 experienced between the time of write of WLn and the present time of read of WLn. For other bit lines whose drain side neighbors are not being detected presently to be in state C, the data of this read of WLn which used $V_{READ}LA(C)$ on WLn+1 will be disregarded.

At step 358, a read process is performed for WLn with the drain side neighbor word line WLn+1 receiving $V_{READ}LA(B)$ ($V_{READ}X = V_{READ}LA(B)$); where $V_{READ}LA(B)$, as compared to $V_{READ}LA(C)$, is closer in value to the $V_{READ}p$ used during program verify. A smaller compensation appropriate for cells whose drain side neighbors are now in state B is delivered. One example of a compensation is $compB = V_{READ}LA(B) - V_{READ}p = 4.9 - 3 = 1.9V$. Thus, $V_{READ}LA(B)$ differs from $V_{READ}p$ by compB. At step 360, the results of step 358 are stored for bit lines with memory cells having neighboring memory cells at WLn+1 in state B. Data for other bit lines is disregarded.

At step 362, a read process is performed for WLn with word line WLn+1 receiving $V_{READ}LA(A)$. ($V_{READ}X = V_{READ}LA(A)$), where $V_{READ}LA(A)$, as compared to $V_{READ}LA(B)$, is closer in value to $V_{READ}p$ used during programming. A yet smaller compensation amount appropriate for cells whose drain side neighbors are now in state A is delivered. One example of a compensation amount is $compA = V_{READ}LA(A) - V_{READ}p = 4.3 - 3 = 1.3V$. Thus $V_{READ}LA(A)$ differs from $V_{READ}p$ by compA. At step 364, the results of step 362 are stored for bit lines with memory cells having neighboring memory cells at WLn+1 in state A. Data for other bit lines is disregarded.

At step 366, a read process is performed for WLn with word line WLn+1 receiving $V_{READ}LA(E)$ ($V_{READ}X = V_{READ}LA(E)$), where $V_{READ}LA(E)$ is identical in value to $V_{READ}p$ used during programming. This delivers no compensation which is appropriate for cells whose drain side neighbors are now in state E as they were at the time of program/verify. This compensation amount is compE=$V_{READ}LA(E)-V_{READ}p=3-3=0.0V$. At step 368, the results of step 366 are stored for bit lines with memory cells having neighboring memory cells at WLn+1 in state E. Data for other bit lines is disregarded. During the process of FIG. 13, the neighboring bit line will receive four voltages. However, each selected memory cell of WLn being read will only make use of or select the results when sensing at the one appropriate voltage corresponding to the state of its adjacent cell at WLn+1. In different implementations, different values of $V_{READ}LA(C)$, $V_{READ}LA(B)$, $V_{READ}LA(A)$ and $V_{READ}LA(E)$ can be determined based on device characterization, experimentation and/or simulation. For more information on the technique of FIG. 13, see U.S. patent application Ser. No. 11/384,057, entitled "Read Operation for Non-Volatile Storage with Compensation for Coupling," by Nima Mokhlesi, incorporated by reference herein in its entirety.

Compensating for the effects of floating gate coupling during non-volatile memory read operations as described for both of above techniques requires access to data read from an adjacent word line WLn+1 during the read operation for a selected word line WLn. In essence, the read/write circuitry (e.g., 130A, 130B) needs access to word line WLn+1 data while determining the data values stored in WLn. This can present a challenge for memory designers, particularly when attempting to minimize chip space dedicated to a particular compensation technique. Consider a memory device having memory cells that store two bits of data. If the data from the neighboring word line WLn+1 is to be available during the read operation for the selected word line WLn, a designer may choose to include enough data latches so that the data from word line WLn+1 and word line WLn can be stored simultaneously during a read operation at the selected word line WLn. If each memory cell stores two bits of data, then four data latches for every bit line are necessary. Two data latches can store the two bits of data from word line WLn+1 and another two data latches can store the two bits of data from word line WLn. Similarly, three additional latches could be used for three-bit devices, four additional latches for four-bit devices, etc. While this technique is effective, the addition of data registers at each bit line for the number of bits stored per cell may not be acceptable in some implementations due to space limitations.

FIG. 14 is a flowchart describing a method of reading a selected word line WLn in accordance with one embodiment. This example is presented for a four-state device storing two bits of data per cell. Sensing for each memory cell is performed at the state A level (between states E and A), the state B level (between states A and B), and the state C level (between states B and C). Compensations are provided when sensing at each level to account for each of the four potential states of the adjacent memory cells at the subsequently programmed word line WLn+1

To select the results of the appropriate sense operation for each memory cell, information about the adjacent memory cell on word line WLn+1 is stored for each bit line while sensing the corresponding cell at WLn. The processor for the bit line will use the information to select the results of the appropriate sense operation. The set of data latches for each bit line is responsible for storing data read from a memory cell of the selected word line. The same set of data latches for each bit line will also store information about a memory cell of the word line adjacent to the selected word line. An additional data latch for each bit line operates as a flag, storing an indication as to whether the data latches are storing data for the selected word line or the adjacent word line.

Thus, the technique in FIG. 14 makes efficient use of the data latches for each bit line such that an extra set of latches is not necessary for storing the data from the adjacent word line WLn+1. In the example of FIG. 14, the memory cells store two bits of data, so three data latches are used. FIG. 14 presents an exemplary embodiment. It will be understood that the disclosed principles are extendable to implementations with different numbers of bits per cell (e.g., 3, 4 or more). In general, the number of required data latches for each bit line is equal to one more than the number of bits stored by each individual memory cell. A single extra latch is utilized for the purpose of identifying the origin of the currently stored data.

In FIG. 14, two data latches labeled DL0 and DL1 are used for each bit line to store data read from the memory cells of the corresponding bit line. A third data latch labeled DL2 is used to store a flag that indicates whether the data currently stored in data latches DL0 and DL1 corresponds to data from the selected word line WLn, or whether the data corresponds to data from the word line WLn+1 adjacent to the selected word line.

The read operation begins by reading the adjacent word line WLn+1 at step 400. The neighboring word line can be read at the three normal reference levels Vra, Vrb and Vrc shown in FIG. 12. No compensation is applied when reading WLn+1 in one embodiment. The data values for the memory cells of the adjacent word line are determined at step 402. The data value for the memory cell of each bit line at word line WLn+1 is stored in a corresponding set of data latches DL0 and DL1 for that bit line at step 404. At step 406, the third data latch DL2 for each bit line is set to logic 0 to indicate that the data in data latches DL0 and DL1 corresponds to data from a memory cell at WLn+1.

A group of sub-reads at the state A level (between states E and A) is performed for the selected word line WLn at steps 408-422. The first sub-read at step 408 provides no compensation to account for floating gate coupling. For example, if an offset read reference voltage compensation technique as shown in FIG. 12 is utilized, step 408 can include applying the read reference voltage Vra to the selected word line without an offset. If a compensation technique as shown in FIG. 13 is utilized, the same read pass voltage $V_{READ}p$ applied to WLn+1 during program verify for WLn is again applied to WLn+1 when sensing at WLn. For instance, $V_{READ}LA(E)=V_{READ}p$ can be applied to WLn+1, $V_{READ}$ applied to each remaining unselected word line, and Vra applied to selected word line WLn.

At step 410, the processor for each bit line determines whether to update the data latches for the bit line. For bit lines where the memory cell of the selected word line was non-conductive during the sub-read at step 408, the processor does not change any values stored in the data latches. For bit lines where the memory cell was conductive, the processor determines if data latches DL0 and DL1 are currently storing data corresponding to state E. For instance, if the data assignments of FIG. 6 are used, the processor determines if the latches are both storing a logic 1. If the latches are not storing logic 11, the processor does not change the values in the data latches. If both latches are storing 11, the processor determines if the third data latch DL2 is storing a logic 0. A logic 0 indicates that latches DL0 and DL1 are storing data from WLn+1 and should be overwritten. The processor may check latch DL2 first and only check latches DL0 and DL1 if DL2 is storing a logic 0 in one embodiment. If both conditions are met for a conductive memory cell, DL0 and DL1 are set to the predetermined data values for the erased state. The third data latch DL2 is set to 1 to indicate that DL0 and DL1 are now storing data for word line WLn. A logic 1 in DL2 precludes latches DL0 and DL from being overwritten during subsequent sub-reads.

At step 412, another state A sub-read is performed. This time, a compensation corresponding to adjacent memory cells at WLn+1 that are programmed to state A is applied. For instance, Vra1 including an offset to Vra as shown in FIG. 12 may be used in one embodiment. In another embodiment, $V_{READ}LA(A)$ may be applied to WLn+1 while Vra is applied to WLn.

The processor at each bit line performs another logic sequence to determine whether to update the latch for bit lines having a conductive memory cell. If DL0 and DL1 are not storing data for state A (e.g., 10), no action is taken. If they are, the processor determines if DL2 is storing a 0 to indicate that WLn+1 data is currently stored. If DL2 is set to 0, the processor overwrites DL0 and DL1 with data for state E. The processor sets DL2 to 1 to indicate that the latches now store the data from WLn.

At step 416, a state A sub-read is performed at WLn while applying a compensation based on cells at WLn+1 that are programmed to state B. For conductive memory cells, the corresponding bit line processor determines if DL0 and DL1 are storing data corresponding to state B (e.g., 00). If not, no action is taken. If so, the processor determines if DL2 is storing logic 0. If not, no further action is taken. If DL2 is set to 0, DL0 and DL1 are overwritten with predetermined data for state E and DL2 is set to 1 to indicate that the latches are now storing data from WLn.

At step 420, a final sub-read at the state A level is performed. A compensation based on adjacent cells at WLn+1 in state C is applied. For conductive memory cells, the corresponding bit line processor determines if the latches are storing data for state 1 (e.g., 01). If DL2 is set to 2, no action is taken. If DL2 is set to 0, the processor determines if DL2 is storing 0. If not, no further action is taken. If so, the processor overwrites DL0 and DL1 with the predetermined data for state E and sets DL2 to 1.

At steps 424-444, a sequence of sub-reads at the state B level are performed for word line WLn. An initial sub-read at step 424 provides no compensation for floating gate coupling. The results of this sub-read are applicable to those cells having an adjacent cell at WLn+1 that is in erased state E. Step 424 can include applying Vrb to WLn while applying a value of $V_{READ}$ to WLn+1 equal to the value used during program verify for WLn (e.g., $V_{READ}LA(E)=V_{READ}p$). For conductive memory cells, the corresponding processor determines if DL0 and DL1 for the bit line are storing data for state E. This step checks to determine that the current sensing at WLn is the one from which data should be stored for the cell. If DL0 and DL1 do not correspond to state E, no action is taken. If DL0 and DL1 match for state E, the processor determines if DL2 is storing logic 0 to indicate that the data in DL0 and DL1 is for WLn+1 and not the selected word line WLn. If DL2 is set to 1, the processor does not overwrite the data in DL0 and DL1. Logic 1 indicates that the DL0 and DL1 data is from WLn, and thus, should not be overwritten. If DL2 is set to 0, the processor overwrites the data in DL0 and DL1 with the data for the current set of sub-reads at step 426. In this case, the processor sets DL0 and DL1 to the state A data (e.g., 10). The processor will also set DL2 to 1 to indicate that DL0 and DL1 are now storing data from the selected word line WLn and should not be overwritten during subsequent sub-reads at WLn.

At step 428, a state B sub-read is performed at word line WLn while applying a compensation based on adjacent cells at WLn+1 in state A. In one embodiment, Vrb1 is applied to WLn. In another embodiment, Vrb is applied to WLn while applying $V_{READ}LA(A)$ to WLn+1. For conductive memory cells, the processor for the corresponding bit line determines if DL0 and DL1 are storing data for state A. If not, no action is taken. If so, the processor determines if DL2 is storing logic 0. If not, no further action is taken for the bit line. If so, the processor overwrites the data in DL0 and DL1 with data corresponding to state A. The processor also sets DL2 to logic 1.

At step 432, WLn is read while applying a compensation for memory cells with an adjacent cell at WLn+1 in state B. If a memory cell is conductive, the processor for the corresponding bit line determines if DL0 and DL1 for that bit line are sharing state B data (e.g., 00). If they are, the processor determines whether the data in DL0 and DL2 is from WLn (DL2=1) or WLn+1 (DL2=0). If the data is from WLn+1, the processor overwrites DL0 and DL1 with predetermined data for state A. The processor also sets DL2 to logic 1. If either condition is not met, the processor does not alter the contents of DL0-DL2.

At step 436, a state B sub-read is performed at WLn while applying a compensation based on adjacent cells at WLn+1 in state C. For conductive memory cells, the processor determines if DL0 and DL1 are storing data for state C (e.g., 01). If not, no action is taken. If so, the processor determines if DL2 is storing logic 0. If not, no action is taken. If so, the processor overwrites the data in DL0 and DL1 with the data for state A and sets DL2 to logic 1.

Steps 440-456 perform a set of sub-reads at the state C read reference voltage level. A first sub-read is performed at step 440 that includes no compensation for floating gate coupling. Vrc can be applied to WLn while applying $V_{READ}LA(E)$ to WLn+1 in one embodiment. For conductive memory cells, the corresponding bit line processor determines if latches DL0 and DL1 store data for state E. If not, no action is taken at that bit line. If so, the processor determines if DL2 is storing logic 0. If not, the data latches are not changed since they already share data for WLn. If DL2 is set to 0, the corresponding processor overwrites the data in DL0 and DL1 with predetermined data corresponding to state B (e.g., 00). The processor also sets DL2 to 1 to indicate that DL0 and DL1 are now storing WLn data.

At step 444, a state C sub-read is performed while applying a compensation based on adjacent memory cells is in state A. Vrc1 may be applied at WLn or $V_{READ}LA(A)$ applied to WLn+1 while applying Vrc at WLn+1. For conductive cells, the bit line processor determines if DL0 and DL1 are storing data for state A. If not, no action is taken. If so, the processor determines if DL2 is storing logic 0. If not, no action is taken. If so, the processor overwrites latches DL0 and DL1 with data for state B, and sets DL2 to logic 1.

At step 448, a state C sub-read is performed while applying a compensation for neighboring cells programmed to state B. Vrc2 can be applied to WLn or $V_{READ}LA(B)$ applied to WLn+1 while Vrc is applied at WLn. For conductive cells, the processor determines if DL0 and DL1 are storing data for state B. If not, the latches are undisturbed. If they are storing data for state B, the processor determines if DL2 is storing logic 0. If not, the latches are not updated. If so, the processor overwrites the data in DL0 and DL1 with the predetermined data for state B. The processor also overwrites the data in DL2 with a 1 to indicate that the data in DL0 and DL1 now corresponds to word line WLn.

At step 452, a final state C sub-read is performed while applying a compensation for neighboring memory cells at WLn+1 in state C. Vrc3 is applied to WLn to effectuate the compensation in one embodiment. In another, Vrc is applied to WLn while applying $V_{READ}LA(C)$ to WLn+1. For conductive cells, the processor determines if DL0 and DL1 are storing data for state C. If not, no action is taken. If so, the processor determines if DL2 is storing a 0. If not, no action is taken. If so, DL0 and DL1 are overwritten with data for state B and DL2 is set to 1.

A final logic sequence is performed at step 456. The bit line processors determine if the third data latch DL2 for any bit line is set to 0. Any bit lines still storing 0 in DL2 have memory cells at WLn that were not conductive during any of the sub-reads at any of the state levels. Accordingly, these memory cells are in the highest programmed state, state C. The processors for these bit lines set DL0 and DL1 to the data for state C (e.g., logic 01) and then set DL2 to 1 to indicate that the latches now store data for WLn.

Figure 14A:
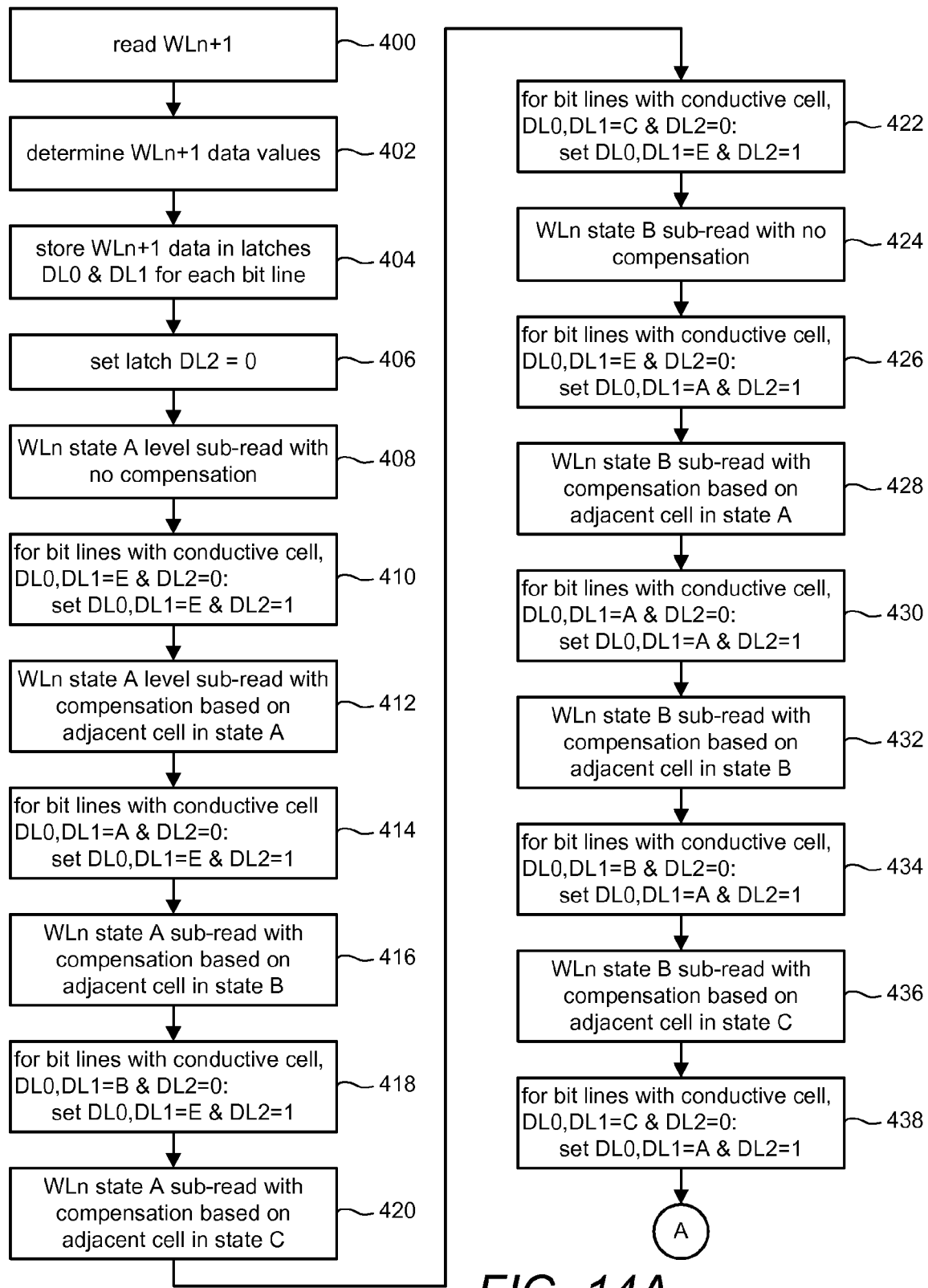
FIGS. 14A-14B depict a flowchart of a method for reading non-volatile storage while compensating for floating gate coupling in one embodiment.
Figure 14B:
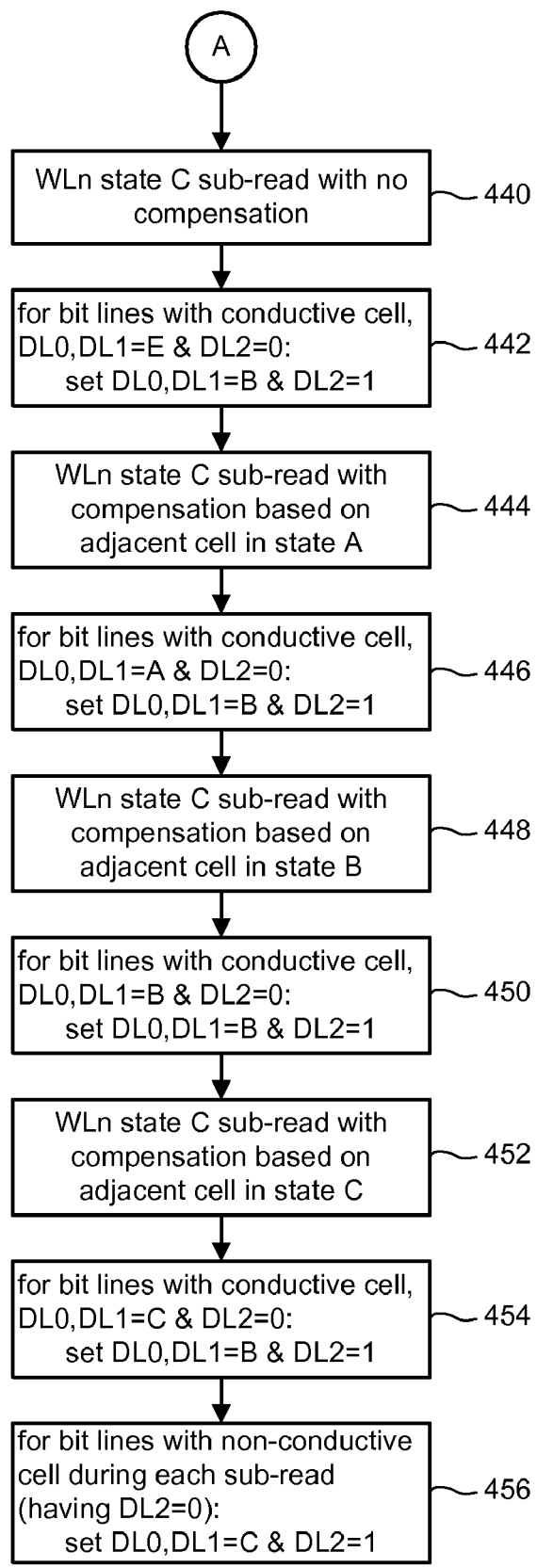

FIGS. 14A-14B presents an embodiment where compensations are used when reading at the state A level. In another embodiment, no compensations are used at the state A level due to the naturally occurring margin between the erased state and state A, as previously described with respect to FIG. 12.

Figure 15A:
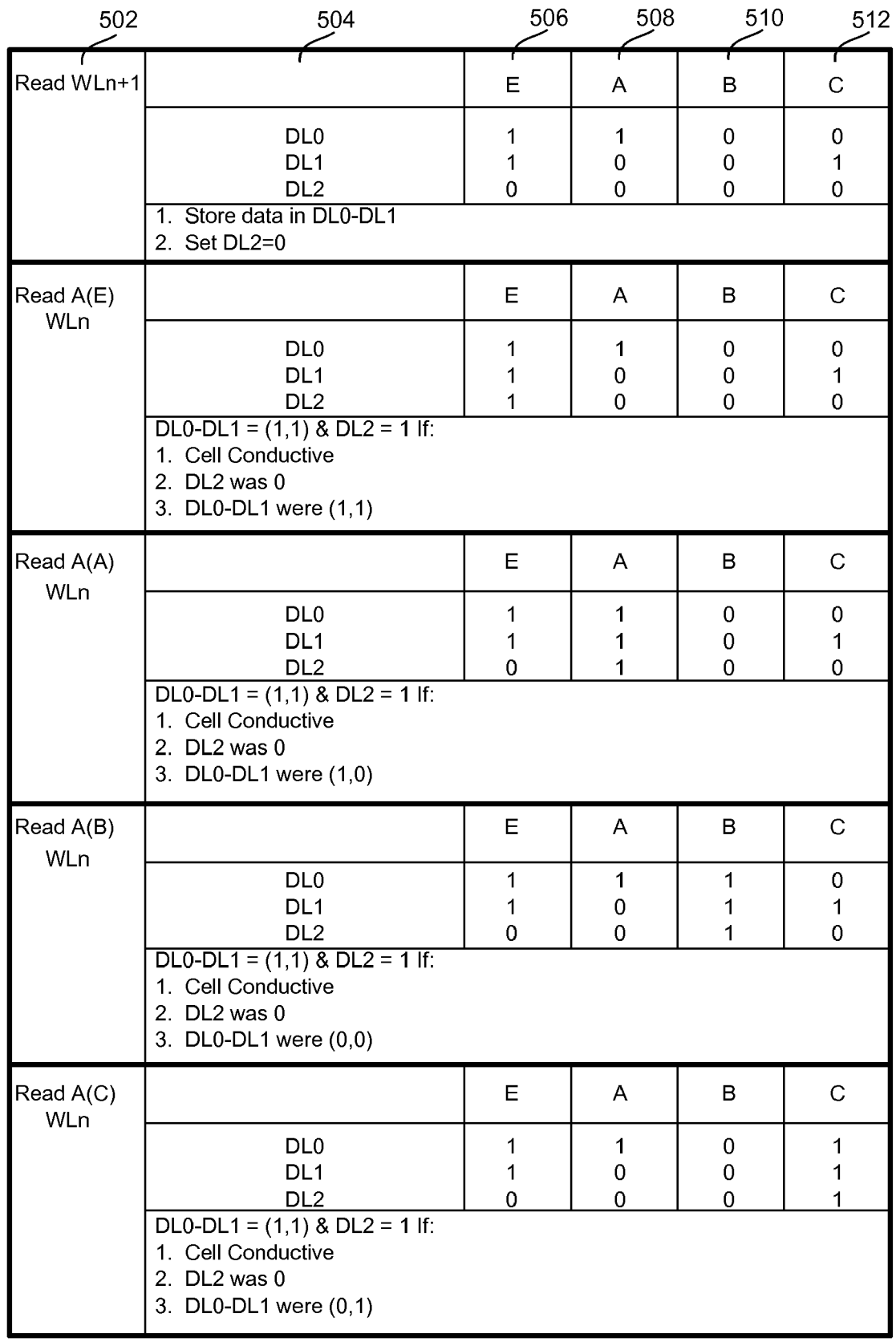
Figure 15B:
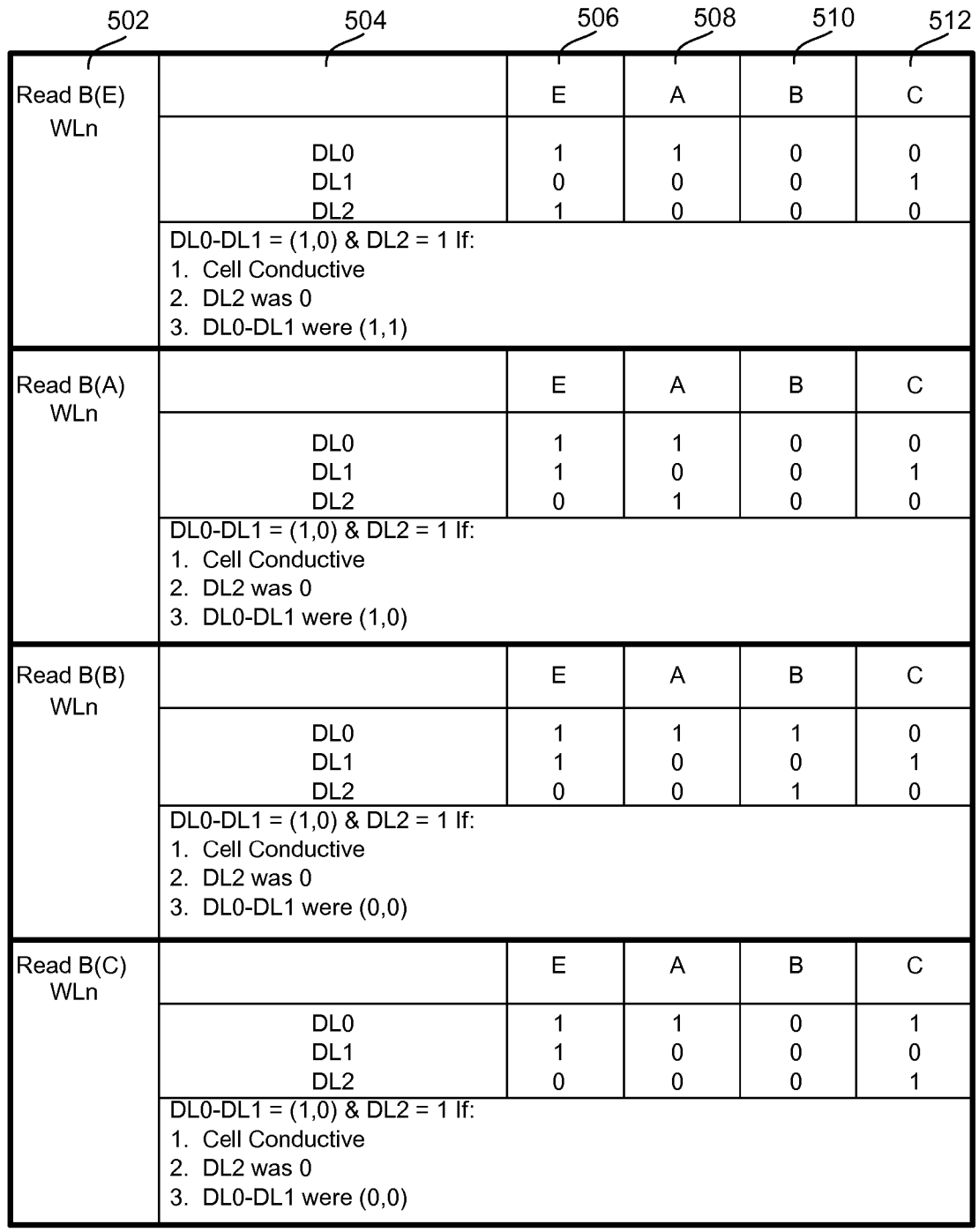

FIGS. 15A-15C depict a table describing the data latch assignment for a read operation in accordance with one embodiment. Column 502 sets forth the various operations or sub-reads performed as part of the read operation for the selected word line WLn. Column 504 lists the data registers DL0-DL2 and for each respective operation in column 502, the logic performed by the bit line processor in response to the corresponding operation. Columns 506, 508, 510 and 512 set forth data values stored by the data latches after each operation. At the top of each column for each sub-read at WLn is listed state E, state A, state B, or state C. State E (column 506) denotes a bit line storing state E data for WLn+1 (DL2=0) in its set of data latches just prior to the corresponding operation in column 502. State A denotes a bit line storing state A data for WLn+1 (DL2=0) in its set of data latches just prior to the corresponding operation in column 502. State B denotes a bit line storing state B data for WLn+1 (DL2=0) in its set of data latches just prior to the corresponding operation in column 502. State C denotes a bit line storing state C data for WLn+1 (DL2=0) in its set of data latches just prior to the corresponding operation in column 502. The third data latch DL2 of each bit line is assumed to be set to 0 just prior to the operation in column 502 at WLn. Because bit lines storing a logic 1 in DL2 prior to the operations at WLn are not updated (already storing WLn data), additional columns to represent these bit lines are not shown for conciseness of explanation.

The first operation or sub-read listed in column 502 is a read operation for the adjacent word line WLn+1. For the read at WLn+1, the states at the top of columns 506-512 denote the state read from the cell at WLn+1. If the memory cell of the bit line at WLn+1 is in state E, DL0 and DL1 are set to 11 as shown in column 506. If the memory cell at WLn+1 is in state A, DL0 and DL1 are set to 10 as shown in column 508. If the memory cell at WLn+1 is in state B, DL0 and DL1 are set to 00 as shown in column 510. If the memory cell of a bit line is in state C, DL0 and DL1 are set to 01 as shown in column 512. In every case, DL2 is set to 0 to indicate that the data in the latches is from WLn+1. Other data encodings can be used.

A set of sub-reads at the state A level begins the operations at WLn. The second listed operation in column 502 is the first sub-read at the state A level for the selected word line. The first subread Read A(E) is performed at the state A level and applies no compensation for floating gate coupling. Thus, the Read A(E) sub-read is applicable to bit lines having a cell at WLn+1 in state E. The conditions or logic for determining whether to update DL0 and DL1 for a particular bit line after the Read A(E) sub-read are set forth in column 504. If the cell at WLn for the bit line is conductive, DL2 was previously set to 0 and DL0-DL1 were previously set to 11, the data latches for the bit line are updated. A bit line storing state E data in DL0-DL1 and having DL2 set to 0 prior to the Read A(E) operation meets the data latch criteria. DL0 and DL1 are updated for these bit lines if the memory cell at WLn is conductive. The values in columns 506-512 next to the Read A(E) sub-read show various data latch data that may be stored after performing the first sub-read at the state A level. The data latches of bit lines having a conductive cell and that were previously storing state E data for WLn+1 are updated. DL0-DL1 remain at 11 and DL2 is set to 1. This is shown in column 506. All bit lines having state A, state B or state C WLn+1 data as shown in columns 508-512 continue to store the same data. All bit lines having a non-conductive cell remain untouched as do those already storing WLn data (DL2=1, not shown).

The next sub-read Read A(A) is a state A level sub-read that applies a compensation based on a neighboring memory cell in state A. The logic in column 504 indicates that the data latches should be updated if the cell at WLn is conductive, DL2 was previously set to 0, and DL0-DL1 were previously set to 10. Bit lines storing state A data for WLn+1 prior to the Read A(A) operation meet the data latch criteria. Column 508 denotes a bit line storing state A data for WLn+1 just prior to the sub-read. The data in the latches for such a bit line is updated to store 11 in DL0-DL1 for state E. DL2 is set to 1 to indicate that DL0 and DL1 are now storing WLn data. Bit lines having latch data set to state E, state B, or state C for WLn+1 as shown in columns 506, 510 or 512 are not changed.

The next sub-read is Read A(B). This sub-read provides a compensation based on neighboring memory cells at WLn+1 that are in state B. The data latches for a bit line are updated if the cell is conductive, DL0-DL1 were previously storing 00, and DL2 was previously set to 0. Bit lines storing state B data for WLn+1 meet the data latch criteria and are updated as shown in column 510 if they have a conductive cell at WLn. Latches DL0 and DL1 are updated to 11 to represent state E data and DL2 is set to 1. Bit lines storing state E, state A or state C data for WLn+1 prior to the sub-read are not updated.

The final sub-read at the state A level is Read A(C), which provides a compensation based on a neighboring cell at WLn+1 in state C. The data latches will be updated for those bit lines with a conductive cell and whose latches were previously storing 01 in DL0-DL1 and a 0 in DL2. The latches for bit lines currently having this data configuration are updated to store 11 in DL0-DL1 and a 1 in DL2 as shown in column 512. Bit lines storing state E, state A or state B data for WLn+1 are not updated as shown in columns 506, 508 and 510.

A set of sub-reads at the state B level begins with the Read B(E) sub-read which applies no compensation. The data latches for bit lines with a conductive cell and that currently store logic 11 in DL0-DL1 and logic 0 in DL2 are updated. For those bit lines, which correspond to WLn+1 latch data set to state E, DL0-DL1 are set to 10 and DL2 is set to 1. This is illustrated in column 506. For those bit lines with a non-conductive cell or data latches set to state A, state B or state C data are not updated as shown in columns 508, 510 and 512.

The Read B(A) sub-read applies a compensation based on a neighboring memory cell at WLn+1 that is in state A. The logic during this sub-read updates the data latches for bit lines having a conductive cell and that are currently storing 10 in latches DL0-DL1 and a 0 in DL2. The data latches for these bit lines are updated to store 10 in latches DL0-DL1 and a logic 1 in DL2 as shown in column 508. Bit lines storing WLn+1 data for state E, state B, or state C are not updated as shown in columns 506, 510, and 512. Likewise, bit lines with a non-conductive cell or DL2=1 are not updated.

The Read B(B) sub-read applies a compensation based on a neighboring memory cell at WLn+1 that is in state B. The logic during this sub-read updates the data latches for bit lines having a conductive cell and that are currently storing 00 in latches DL0-DL1 and a 0 in DL2. The data latches for these bit lines are updated to store 10 in latches DL0-DL1 and logic 1 in DL2 as shown in column 510. Bit lines storing WLn+1 data for state E, state A or state C prior to the sub-read are not updated as shown in columns 506, 508, and 512. Bit lines with a non-conductive cell or DL2=1 are not updated.

The Read B(C) sub-read applies a compensation based on a neighboring memory cell at WLn+1 that is in state C. The data latches for bit lines having a conductive cell and that are currently storing 01 in DL0-DL1 and logic 0 in DL2 are updated. The data latches for these bit lines are updated to store 10 in DL0-DL2 and logic 1 in DL2. Bit lines storing WLn+1 data for state E, state A or state C are not updated, as shown in columns 506, 508 and 510. Bit lines with a non-conductive cell or DL2=2 are not updated.

A set of sub-reads at the state C reference level begin with a Read C(E) sub-read, applying no compensation. If a bit line has a conductive cell during sensing, the processor for that bit line determines if the bit line latches are currently storing 11 in DL0-DL1 and 0 in DL2. If so, the processor updates the latches for the bit line to the data shown in column 506. DL0-DL1 are set to 00 and DL2 is set to 1. For those bit lines with a non-conductive cell, or a conductive cell but that currently hold data for state A, B or C (columns 508-512), the latches are not updated. Likewise, bit lines that have DL2 set to 1 are not updated since they already store WLn data.

The Read C(A) sub-read applies a compensation based on a neighboring memory cell at WLn+1 that is in state A. The processors for bit lines having a conductive cell determine if the bit line's latches are currently storing 10 in DL0-DL1 and 0 in DL2. If so, the processor updates the latches as shown in column 508. DL0-DL1 are updated to 00 and DL2 is updated to logic 1. Bit lines with a non-conductive cell, or a conductive cell but that currently hold WLn+1 data of state E, state B or state C are not updated as shown in columns 506, 510 and 512. Bit lines having DL2=1 are not updated.

The Read C(B) sub-read applies a compensation based on a neighboring memory cell at WLn+1 that is in state B. The latches for bit lines having a conductive cell are checked to determine if they are currently storing 00 in DL0-DL1 and logic 0 in DL2. The latches for these bit lines are updated as shown in column 510 to store 00 in DL0-DL1 and 1 in DL2. Bit lines with non-conductive cells are not updated. Bit lines currently storing state E, A or C data for WLn+1 are not updated. Bit lines having DL2=1 are not updated.

The Read C(C) sub-read applies a compensation based on a neighboring memory cell at WLn+1 that is in state C. The latches for conductive bit lines are checked to determine if they are currently storing 01 in DL0-DL1 and 0 in DL2. If so, they are updated as shown in column 512 to store 01 in DL0-DL1 and logic 1 in DL2. Bit lines with non-conductive cells are not updated. Bit lines having D12 set to 1 or that are storing state E, A or B data for WLn+1 are not updated.

Column 504 specifies a final set of logic that is performed after completing the sets of sub-reads. If DL2 is storing a logic 0 for any bit line after the last sub-read at the state C level, the memory cell at WLn for that bit line was not conductive during any of the sub-reads. Thus, the cell is programmed to state C. The processor associated with the bit line will set DL0 and DL1 to 01, representing the data for state C. The processor will set the third data latch DL2 for these bit lines to 1 to indicate that DL0-DL1 are now storing data for WLn.

Figure 16:
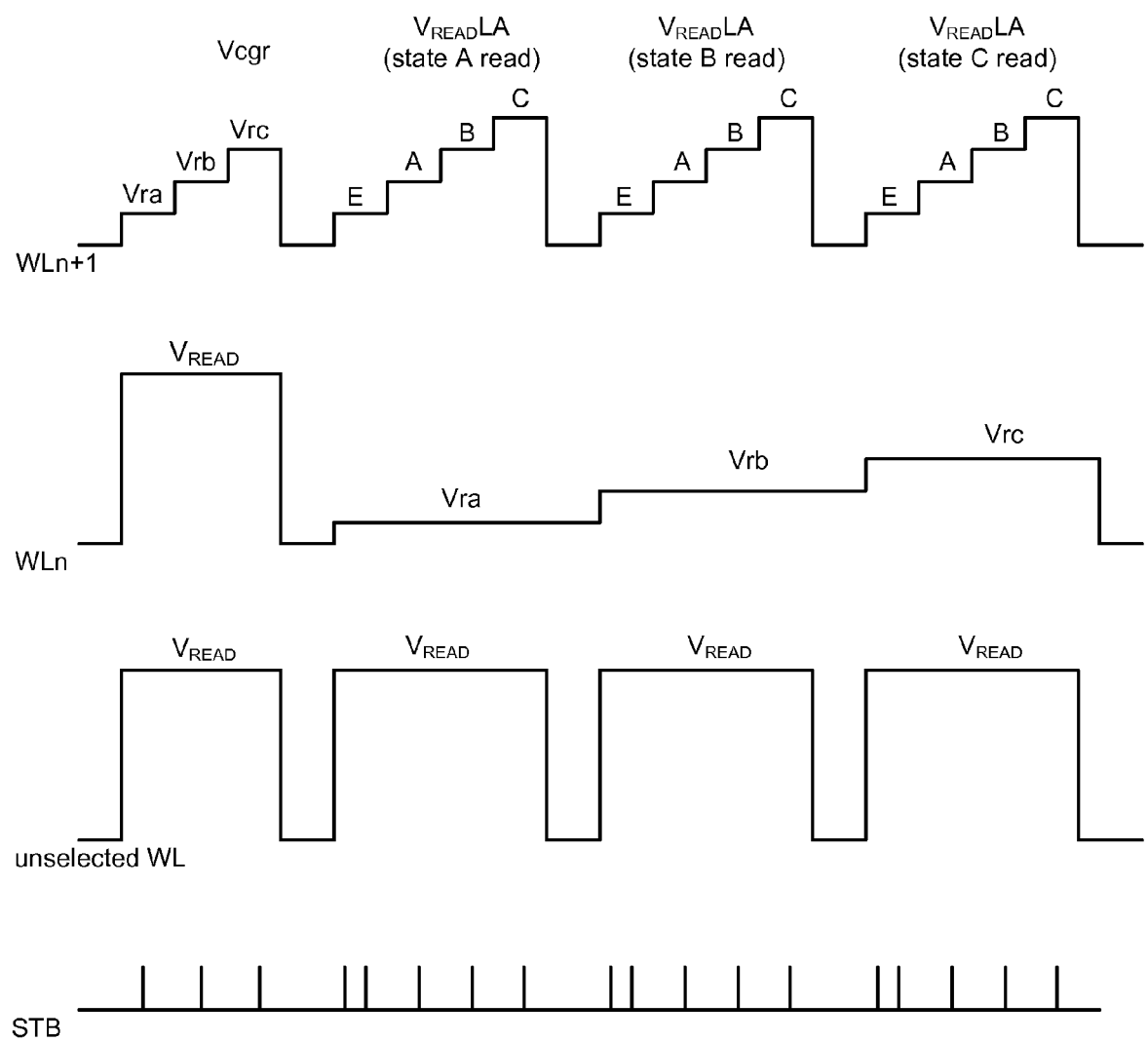
FIG. 16 is a timing diagram depicting various voltage signals for performing a read operation in one embodiment.

FIG. 16 is a timing diagram of the various signals of a memory system during a read operation in accordance with one embodiment. The signals applied to a selected word line WLn, an adjacent unselected word line WLn+1, and each remaining unselected word line are depicted. A strobe signal that initiates sensing by the sense module is also depicted. The first part of the read operation for WLn includes reading the adjacent word line WLn+1. The selected word line is raised to a pass voltage $V_{READ}$ so that all the memory cells thereon operate as pass gates. The adjacent word line is read by applying the appropriate read reference voltages Vcgr. FIG. 16 describes an exemplary four-state device so three read reference voltages Vra, Vrb, and Vrc are used. Cells that conduct at Vra are in state E. Cells that conduct at Vrb but not Vra are in state A. Cells that conduct at Vrc but not Vra or Vrb are in state B. And cells that do not conduct at any of the voltages are in state C. The data values for the memory cells at WLn+1 are stored in data latches DL0 and DL1 for each corresponding bit line. A third data latch DL2 is set to 0 to indicate that the data is for WLn+1.

The actual sub-reads at the selected word line begin after reading the adjacent word line. A set of sub-reads is first performed at the state A reference voltage level. The state A read voltage Vra is applied to the selected word line throughout each sub-read. A first read pass voltage $V_{READ}LA(E)$ is applied to the adjacent word line WLn+1 for a first sub-read. The first read pass voltage provides no compensation based on floating gate coupling. The results of this sub-read stores state E data for conductive memory cells at WLn having a neighboring cell at the adjacent word line WLn+1 in state E. In response to a conductive memory cell, the bit line processor determines if latches DL0 and DL1 are storing data corresponding to the sub-read compensation level state E (e.g., 11). If so, the processor checks DL2 to determine if the data in DL0 and DL1 is for WLn+1. If so, the processor will overwrite DL0 and DL1 with data for state E and set DL2 to 1 to indicate that DL0 and DL1 are now storing data for WLn+1 and should not be overwritten during subsequent sub-reads.

A second read pass voltage $V_{READ}LA(A)$ is then applied to the adjacent word line, while Vra continues to be applied to WLn. For conductive cells this time, the corresponding bit line processor checks to determine if latches DL0 and DL1 are storing data for state A and whether latch DL2 is storing a 0. If both conditions are met, the processor will overwrite the DL0 and DL1 data with data for state E and set DL2 to 1.

A third read pass voltage $V_{READ}LA(B)$ and fourth read pass voltage $V_{READ}LA(C)$ are then applied. The steps outlined above and as also outlined with respect to FIG. 13 are repeated during application of each read pass voltage.

The first set of sub-reads ends after applying $V_{READ}LA(C)$ in conjunction with Vra. The second set of sub-reads begins by applying the second read reference voltage Vrb to the selected word line. Since conductive cells at the Vra level were locked out from having the data latches overwritten by setting the flag in DL2, conductive cells at the Vrb level are indicative of cells in state A.

A first sub-read is performed while applying no compensation to the adjacent word line WLn+1. $V_{READ}LA(E)$ is applied, corresponding to adjacent cells in state E. For conductive memory cells whose corresponding bit line data latches are storing data for state E, the data latches are overwritten with state A data if DL2 is set to 0. If either DL2 is set to 1 or DL0 and DL1 were storing data for another state, no action is taken. The second sub-read at the state B level is then performed by applying $V_{READ}LA(A)$ to the adjacent word line. The data in DL0 and DL1 is overwritten with state A data for conductive memory cells having DL0 and DL1 set to state A and DL2 set to 1. Two additional sub-reads are performed by applying the read pass voltages $V_{READ}LA(B)$ and $V_{READ}LA(C)$. The logical steps are repeated as described in FIGS. 13 and 14A-14B.

A final set of sub-reads is performed at the state C level. The state C read reference voltage Vrc is applied to the selected word line. The four read pass voltages are again applied sequentially to the adjacent word line. Each bit line processor performs the logical steps outlined previously to update the latches when appropriate and to switch the third data latch to indicate when WLn data is stored.

Sensing by each sense module is initiated by the strobe signal depicted at the bottom of FIG. 16. A single strobe is used at each reference level Vra, Vrb and Vrc when reading at WLn+1. When sensing at WLn, two strobes are used for the first sub-read at each level and a single strobe is used for each of the three remaining sub-reads.

Two strobes are often used during read operations to minimize source voltage errors due to current flow in the source line. The source line has a finite resistance to ground. The read/write circuits 130A, 130B operate on a page of memory cells simultaneously. The conduction current of each memory cell flows from the sense module through the bit line into drain of the memory cell and out from the source before going through a source line to ground. When a common source line is used and connected to some external pad, a finite resistance remains between the source electrode of a memory cell and the pad, even when metal strapping is used to reduce the resistance of the source line. When a finite resistance exists between the source electrode of a memory cell and the ground pad, the voltage drop across the resistance is equal to the product of the total conduction current of all the cells and the finite resistance. This can lead to sensing errors.

A method to reduce the errors is often accomplished by multi-pass sensing. Each pass helps identify and shut down the memory cells with conduction currents higher than a given demarcation value. In this way, sensing in subsequent passes will be less affected by source line bias since the higher current cells have been shut down. In one embodiment, memory cells that have a conduction current above the demarcation point are turned off by setting the drain voltage of their bit lines to ground (e.g., by setting an appropriate value in bit line latch 202). Because of the removal of the high current cells, more accurate sensing of the remaining cells is achieved.

When reading at WLn+1, a single strobe is used at each level since read accuracy is not as crucial when determining neighbor charge level or state information. Two strobes are used for the first sub-read at each level but only one strobe is used for each remaining sub-read at the same level. The two strobes illustrated in FIG. 16 correspond to two passes of sensing as described. Memory cells that conduct during the first sub-read have their bit lines set to ground for the remaining sub-reads at that level to reduce the voltage drop due to the source line bias. After turning off these memory cells during the first sub-read, single pass sensing (one strobe) can be used for the remaining sub-reads at the same level. Because the cells that were turned off during the first sub-read decrease the source line bias voltage drop, accurate sensing is still achieved. This represents an improvement over techniques that may apply each different reference voltage level to the selected word line in sequence with a first value of $V_{READ}$ at WLn+1, and repeating with different values of $V_{READ}$ at WLn+1, etc. Because such techniques increment the voltage applied at the selected word line in sequence like this, two-pass sensing at each sub-read may be required. Single pass sensing as presently disclosed will use less energy and improve performance times.

Figure 17:
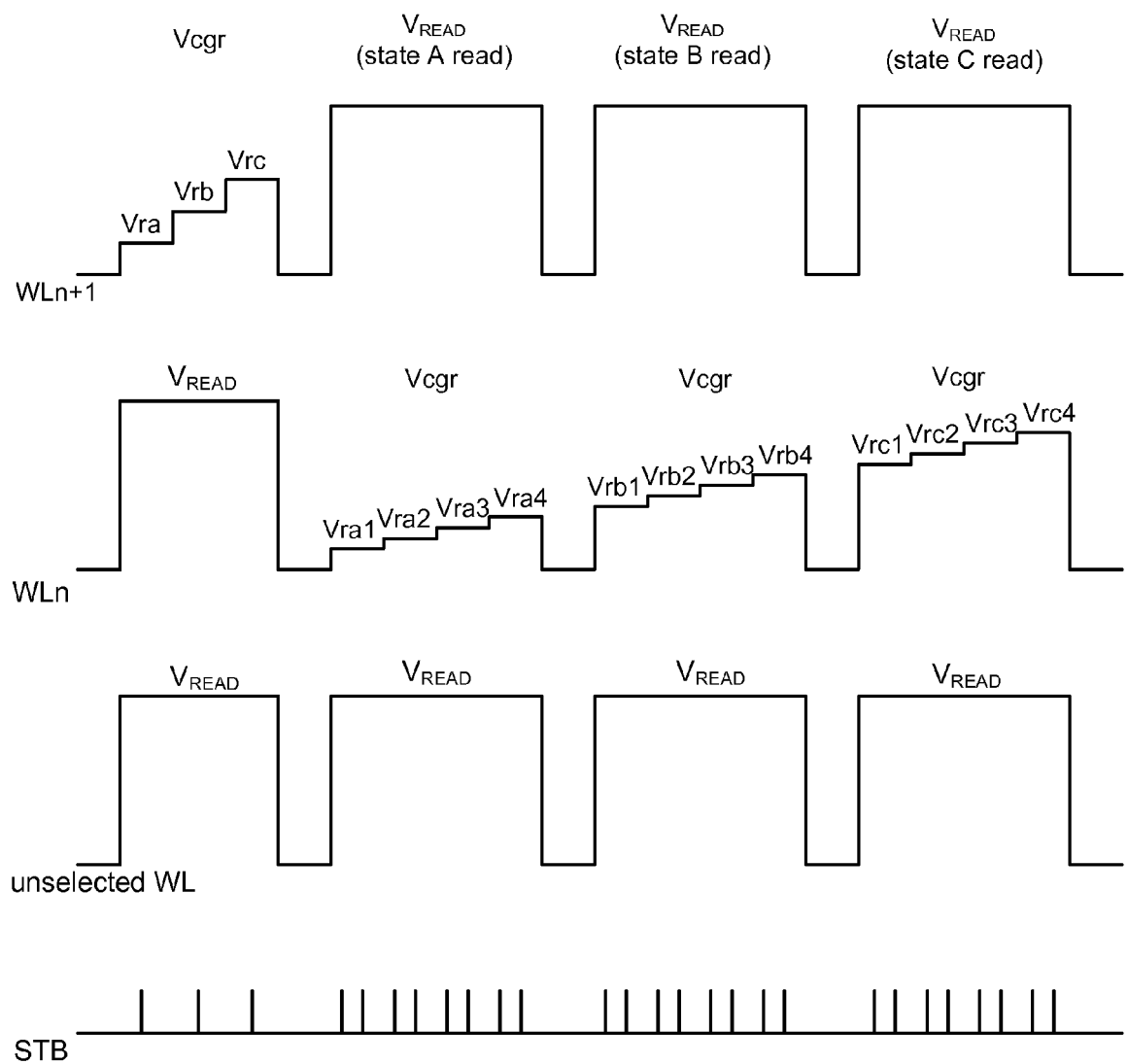
FIG. 17 is a timing diagram depicting various voltage signals for performing a read operation in one embodiment.

FIG. 17 is a timing diagram for an embodiment that corresponds to compensation as shown in FIG. 12. As with the previous technique, the adjacent word line is read first by applying $V_{READ}$ to the selected word line and stepping through the three read reference voltages Vra, Vrb, and Vrc. The data from the adjacent word line WLn+1 is stored in the data latches for each bit line and the third data latch is set to 0 to indicate that the data is for word line WLn+1.

After reading the adjacent word line, the sets of sub-reads for the selected word line WLn begin. The adjacent word line is raised to $V_{READ}$ for each of the sub-reads of the first set so that the memory cells thereon operate as pass gates. Each other unselected word line is also raised to $V_{READ}$ so their memory cells operate as pass gates. The selected word line has four different read reference voltages applied for the first state level. A first read reference voltage Vra is applied that does not include any compensation based on the state of an adjacent memory cell at WLn+1. The results of sensing at this level are stored for memory cells having an adjacent cell at WLn+1 in erased state E. For cells that are conductive under application of Vra, the corresponding processor determines if data latches DL0 and DL1 are storing data for state E. If so, the processor checks whether DL2 is storing 0 to indicate the data currently in DL0 and DL1 is for WLn+1. If both conditions are met, the processor overwrites the data in DL0 and DL1 with data for the current set of sub-reads. At the state A level sub-reads, the processor sets the latches equal to the state E data (e.g., 11). For all other bit lines no action is taken. These steps are repeated for each of the remaining read reference voltages. Vra1 corresponds to adjacent memory cells in state A, Vra2 corresponds to adjacent memory cells in state B, and Vra3 corresponds to adjacent memory cells in state C. The processors for each bit line perform the sequence of logic steps to determine if the data latches should be overwritten. If data is to be overwritten, the corresponding processor overwrites the data with the data for state E and sets the third data latch to 1 to indicate that the latches now store data for word line WLn.

In the embodiment of FIG. 17, two strobes are used for sensing during each sub-read at the state A level (and at the state B and state C levels hereinafter described). Because the voltage applied to the selected word line during each set of sub-reads at a particular level is increased for each subsequent sub-read, two strobe sensing is used.

After performing each of the state A level sub-reads for the selected word line WLn, a second set of subreads at the state B level is performed. The adjacent word line is again raised to $V_{READ}$ to operate as a pass gate as is each other unselected word line. The first state B read reference voltage is applied to word line WLn. The first read reference voltage does not compensate for floating gate coupling. Accordingly, bit lines having DL0 and DL1 set to the state E value, and having DL2 set to 0 to indicate they are storing WLn+1 data, have their data latches updated. For these bit lines, DL0 and DL1 will be set to the value for state A (e.g., 10) and DL2 set to 1 to indicate that they are now storing data for WLn. This process is repeated at the remaining state B read levels Vrb1, Vrb2, and Vrb3.

A final set of sub-reads is performed at the state C level. $V_{READ}$ is applied to the adjacent word line WLn+1. State B read reference voltages Vrc, Vrc1, Vrc2, and Vrc3 are applied in sequence and the results of sensing used to overwrite the data latch values for the appropriate bit lines as already described.

The methods described with respect to FIGS. 14-17 are presented with respect to full sequence programming, where two bits of one logical page are stored for each memory cell as shown in FIG. 6. Data programmed according to an upper and lower page technique as shown in FIG. 7 can also be read using a similar sensing sequence and data latch configuration.

The adjacent word line WLn+1 can be read and the data for each bit line stored in registers DL0 and DL1 (assuming 2-bit devices). If the lower page data is being read for the selected word line, it is only necessary to read at the state A (e.g., Vra) and state C (e.g., Vrc) reference levels. Steps 408-420 of FIGS. 14A-14B can be performed at the selected world line followed by steps 440-454. Since the read operation is only determining one bit of data for each cell of the selected word line, a single data latch is needed for storing the data from WLn. The lower page data can be stored in DL0, for example. Steps 408-420 would be modified to set DL0 to logic 1 in response to a conductive cell during the appropriate sensing operation for that bit line based on the data from WLn+1. DL2 will be set to logic 1 when WLn data is stored as earlier described. Steps 440-454 would be modified to set DL0 to logic 0 in response to a conductive memory cell during the appropriate sensing operation for that bit line based on the data from WLn+1. For bit lines that have a non-conductive cell during the state A and state C level sub-reads, DL0 is set to logic 1 and DL2 set to logic 1.

For an upper page read, it is only necessary to read at the state B reference level (e.g., Vrb). A single latch is needed to store the upper page data. The data can be stored in DL0 or DL1, for example. Steps 424-438 of FIGS. 14A-14B can be performed for the selected word line after reading WLn+1, storing the data in latches DL0 and DL1, and setting DL2 to 0. If a memory cell is conductive during the appropriate sub-read at the state B level, DL1 can be set to logic 1 and DL2 set to logic 1. If the memory cell does not conduct during any of the state B sub-reads, DL0 is set to 0 for the bit line and DL1 is set to 1.

The compensation and data latch assignments can similarly be incorporated to read data programmed according to the technique described in FIGS. 8A-8C. When reading data as programmed according to the process of FIGS. 8A-8C, any perturbation from floating gate coupling due to programming the lower page of neighboring cells should be corrected when programming the upper page of the memory cell under question. Therefore, when attempting to compensate for floating gate coupling from neighboring cells, one embodiment of the process need only consider the coupling effect due to programming of the upper page of neighboring cells. A process may therefore read upper page data for the neighboring word line. If the upper page of the neighboring word line was not programmed, then the page under consideration can be read without compensating for floating gate coupling. If the upper page of the neighboring word line was programmed, then the page under consideration should be read using some compensation for floating gate coupling. In some embodiments, the read operation performed for the neighboring word line results in a determination of charge levels on the neighboring word line, which may or may not accurately reflect the data stored thereon. Also, note that the selected word line to be read, i.e. WLn, may itself have only lower page data. This can happen when the entire block has not yet been programmed. In such a situation it is always guaranteed that the cells on WLn+1 are still erased, and therefore, no coupling effect has yet plagued WLn cells. This means that no compensation is required so the lower page read of a word line whose upper page has yet to be programmed can proceed as usual without the need for any compensation technique.

In one embodiment, a memory array implementing the programming process of FIGS. 8A-8C will reserve a set of memory cells to store one or more flags. For example, one column of memory cells can be used to store flags indicating whether the lower page of the respective rows of memory cells has been programmed and another column of memory cells can be used to store flags indicating whether the upper page for the respective rows of memory cells has been programmed. In some embodiments, redundant cells can be used to store copies of the flag. By checking the appropriate flag, it can be determined whether the upper page for the neighboring word line has been programmed. More details about such a flag and the process for programming can be found in U.S. Pat. No. 6,657,891, Shibata et al., "Semiconductor Memory Device For Storing Multi-Valued Data," incorporated herein by reference in its entirety.

Figure 18:
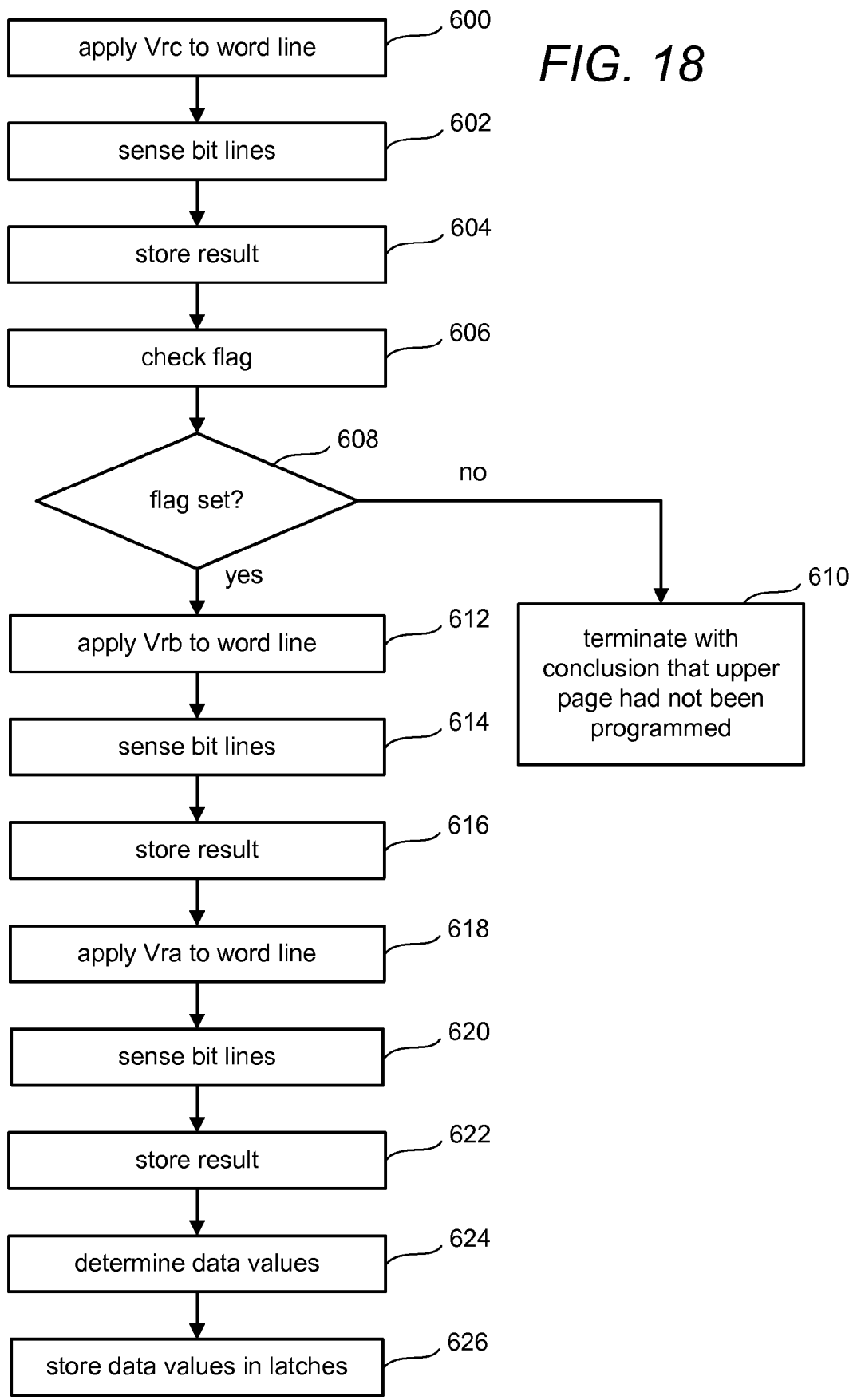
FIG. 18 is a flowchart of a method for reading an adjacent word line in accordance with one embodiment.

FIG. 18 describes one embodiment of a process for reading the upper page data for a neighboring word line such as the drain side neighbor WLn+1. At step 600, read reference voltage Vrc is applied to the word line associated with the page being read. At step 602, the bit lines are sensed. In step 604, the results of step 602 are stored in the appropriate latches. At step 606, the system checks the flag indicating upper page programming associated with the page being read. In one embodiment, the memory cell storing the flag will store data in state E if the flag is not set and in state C if the flag is set. Therefore, when that particular memory cell is sensed at step 602, if the memory cell conducts (turns on), then the memory cell is not storing data in state C and the flag is not set. If the memory cell does not conduct, then it is assumed in step 606 that the memory cell is indicating that the upper page has been programmed. Other means for storing a flag can be used, such as by storing the flag in a byte of data.

If the flag has not been set (step 608), then the process of FIG. 18 terminates with the conclusion that the upper page has not been programmed. A standard read process without compensation for coupling can be performed at WLn. If lower page data is being read from WLn, sensing at the state B level (e.g., Vrb) is sufficient to determine the lower page data. If upper page data is being read, sensing is performed at the state A (e.g., Vra), state B (e.g., Vrb) and state C levels (e.g., Vrc).

If the flag has been set (step 608), then it is assumed that the upper page has been programmed and at step 612 voltage Vrb is applied to the word line associated with the page being read. At step 614, the bit lines are sensed as discussed above. At step 616, the results of step 614 are stored in the appropriate latches. At step 618, voltage Vra is applied to the word line associated with the page being read. At step 620, the bit lines are sensed. At step 622, the results of step 620 are stored in the appropriate latches. At step 624, processor 212 determines the data value stored by each of the memory cells being read based on the results of the three sensing steps 602, 612 and 618. At step 626, the data values determined in step 624 are stored in the appropriate data latches. In step 624, processor 392 determines the values of the upper page and lower page data using well known simple logic techniques dependent on the specific state coding chosen. For example, for the coding described in FIGS. 8A-8C, the lower page data is Vrb* (the complement of the value stored when reading at Vrb), and the upper page data is Vra* OR (Vrb AND Vrc*). Similar techniques as already described are used in an alternative embodiment to store the data after each individual sense operation.

In one embodiment, the process of FIG. 18 includes the application of $V_{READ}$ to the drain side neighboring word line.

Therefore, $V_{READ}X=V_{READ}$ for the process of FIG. 18. In another embodiment of the process of FIG. 22, $V_{READ}X=V_{READ}LA(E)$.

It is only necessary to compensate for floating gate coupling due to programming the upper page of WLn+1 when reading cells programmed according to the technique of FIGS. 8A-8C. The full data from WLn+1 can be stored in the latches in one embodiment (e.g., two bits stored in DL0 and DL2). If a cell of WLn+1 is in state E or state B, no compensation is used when reading an adjacent cell at WLn. If the cell is in state A or state C, a compensation can be applied.

Figures 19, 20:
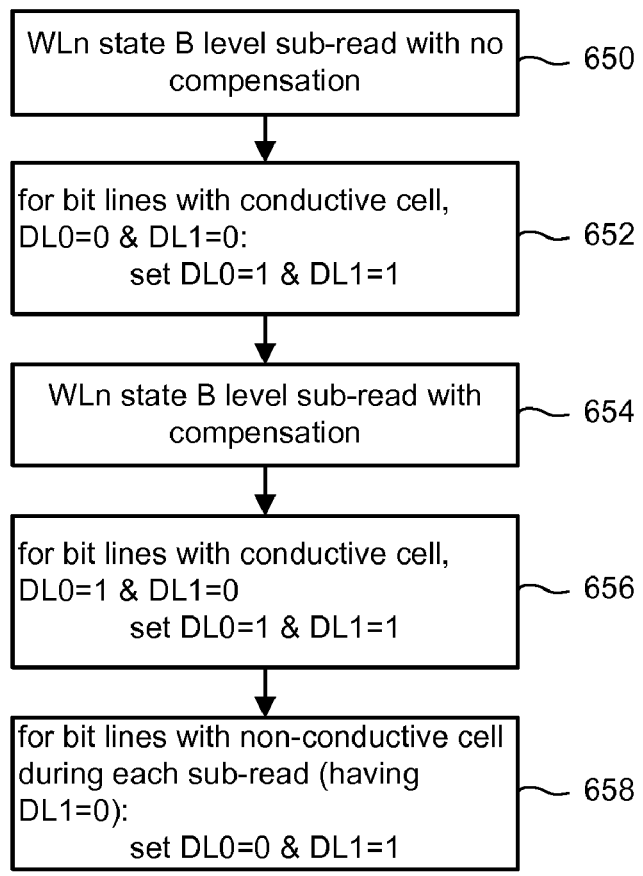
FIG. 19 is a table describing a technique for providing an indication as to whether a compensation should be used when reading a particular bit line based on adjacent word line data.
FIG. 20 is a flowchart for reading lower page data from a selected word line including compensation for floating gate coupling in one embodiment.

Because it is only necessary to either provide a compensation or not, a single bit of data is stored for WLn+1 in one embodiment. FIG. 19 provides a chart explaining steps to perform a determination whether to use an offset for a particular bit line that requires one latch to store WLn+1 data. The first step is to perform a read process using Vra on the word line. The second step is to perform a read using Vrb. When reading at Vra, a latch stores a 1 if the memory cell is in state E and a 0 if the memory cell is in states A, B, or C. When reading at Vrb, the latch will store a 1 for states E and A, and store a 0 for states B and C. The third step of FIG. 19 includes performing an XOR operation on the inverted results from the second step with the results from step 1. In the fourth step, a read is performed using Vrc at the word line. A latch stores a 1 for states E, A and B, and stores a 0 for state C. In the fifth step, the results of step 4 and step 3 are operated by a logical AND operation. Note that steps 1, 2 and 4 may be performed as part of FIG. 18. Steps 3 and 5 of FIG. 19 can be performed by dedicated hardware or by processor 212. The results of step 5 are stored in a latch with 1 being stored if no compensation is needed and 0 being stored if compensation is needed. Thus, a compensation will be required for those cells that are read on WLn that have neighboring memory cells on WLn+1 that are in the A or C state. This approach requires only one latch to determine whether to correct WLn or not.

Figure 21:
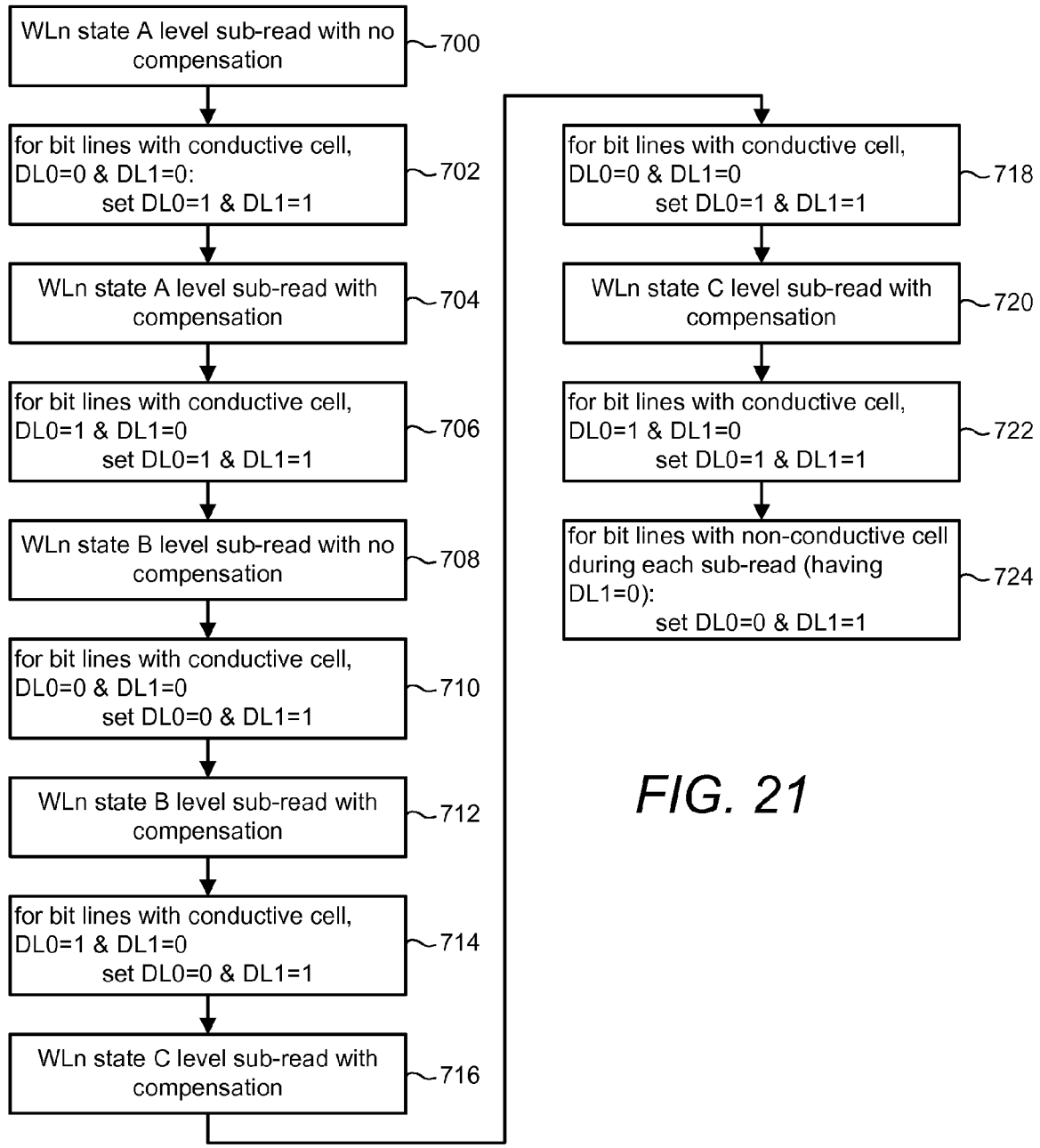
FIG. 21 is a flowchart for reading upper page data from a selected word line including compensation for floating gate coupling in one embodiment.

After reading and storing information from WLn+1, the selected word line WLn is read. If the page being read is the lower page, then FIG. 20 is performed. If the upper page is being read, FIG. 21 is performed. FIGS. 20 and 21 are presented with respect to an example that only stores one bit of data to indicate whether a compensation should be used at WLn based on WLn+1. Other embodiments can store the full WLn+1 data. In FIGS. 20 and 21, DL0 is used to indicate whether the corresponding cell at WLn is in state E/B (DL0=0) or state A/C (DL0=1). A compensation is used if DL0=1 and no compensation is used if DL0=0.

Lower page data stored using the data encoding scheme illustrated in FIGS. 8A-8C can be determined by reading at the state B reference level. A first sub-read is performed at step 650 without applying any compensation. The processors of bit lines having a conductive memory cell check to determine whether DL0 is storing logic 0. This indicates that the adjacent cell at WLn+1 is in state E or state B, and thus, no compensation is needed when reading WLn DL1. If DL0 is set to 0, the processor checks DL1 to see if it is set to 0, indicating that DL0 is storing WLn+1 data. If DL0 and DL1 are both set to 1, the processor sets DL0 to logic 1. The processor also sets DL1 to logic 1 to indicate that DL0 is storing data for WLn.

At step 654, another WLn state B level sub-read is performed while applying a compensation for floating gate coupling. If the memory cell of a bit line is conductive during the compensated sub-read, and is storing a logic 1 in DL0 and logic 0 in DL1, the processor sets DL0 to 0 and DL1 to logic 2 at step 656. This indicates that the latches are now storing lower page data of logic 0 for WLn.

At step 658, it is determined if any bit lines are storing logic 0 in DL1. This indicates that the corresponding memory cell was non-conductive at each sub-read. For these bit lines, DL0 is left at logic 0 and DL1 is set to 1 to indicate the latches are storing lower page data of logic 0 for WLn.

If the page being read is the upper page, the method of FIG. 21 is performed. Reading needs to be performed at the state A, state B, and state C reference levels to determine the upper page data for the word line. DL0 for each bit line will store data for the upper page although DL1 could store upper page data and a third latch DL2 used to store the flag. An uncompensated sub-read at the state A level is performed for WLn at step 700. If the memory cell of a bit line is conductive, DL0 is currently set to logic 0 and DL1 is currently set to logic 0, the processor sets DL0 to logic 1 and DL1 to logic lat step 702. A compensated sub-read is performed at WLn at step 704. If the memory cell of a bit line is conductive, DL0 is currently set to logic 1, and DL1 is currently set to logic 0, the processor sets DL0 to logic 1 and DL1 to logic 1 at step 706.

An uncompensated sub-read at the state B level is performed for WLn at step 708. If the memory cell of a bit line is conductive, DL0 is currently set to logic 0, and DL1 is currently set to logic 0, the processors sets DL0 to logic 0 and DL1 to logic 1 at step 710. A compensated sub-read is performed at WLn at step 712. If the memory cell of a bit line is conductive, DL0 is currently set to logic 1 and DL1 is currently set to logic 0, the processor sets DL0 to logic 0 and DL1 to logic 1 at step 714.

An uncompensated sub-read at the state B level is performed for WLn at step 716. If the memory cell of a bit line is conductive, DL0 is currently set to logic 0 and DL1 is currently set to 0, the processor sets DL0 to logic 1 and DL1 to logic 1 at step 718. A compensated sub-read is performed at the state B level for WLn at step 720. If the memory cell of a bit line is conductive, DL0 is currently set to logic 1 and DL1 is currently set to logic 0, the processor sets DL0 to logic 1 and DL1 to logic 1 at step 722.

For bit lines having a non-conductive memory cell during each sub-read (still storing logic 0 in DL1), the memory cell is in state C. Thus, at step 724, DL0 is set to logic 0 and DL1 is set to logic 1.

Figure 22:
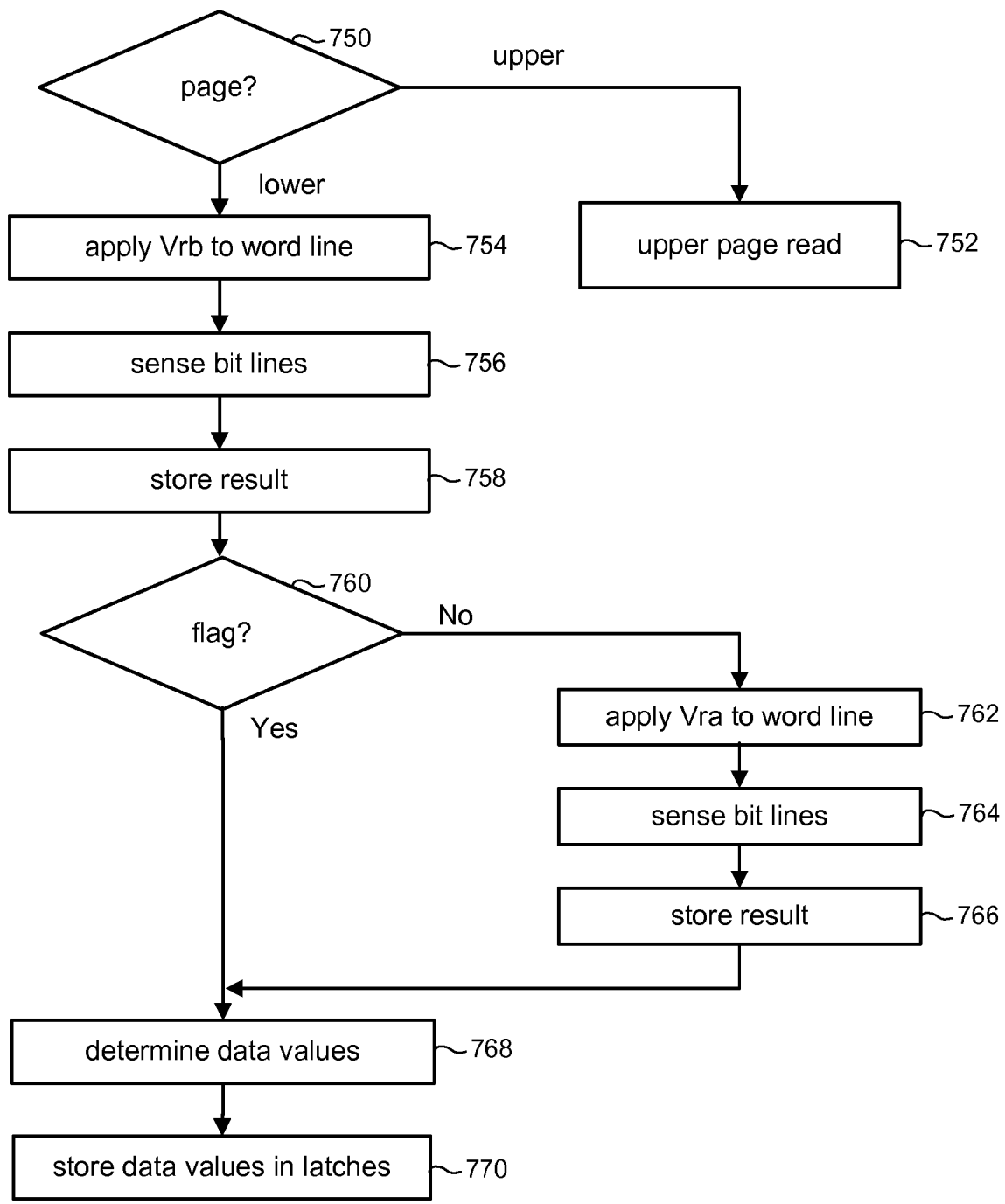
FIG. 22 is a flowchart for reading a selected word line without providing compensation in accordance with one embodiment.

FIG. 22 is a flow chart describing one embodiment of a process for reading data of the word line under consideration when the system does not need to compensate for floating gate to floating gate coupling from a neighboring word line. FIG. 22 may be performed in response to a determination that the upper page of the adjacent word line has not been programmed (step 610 of FIG. 18). At step 750, it is determined whether the read is for the upper page or lower page associated with the word line under consideration. If the read is for the lower page, then in step 754 voltage Vrb is applied to the word line associated with the page being read. At step 756, the bit lines are sensed. At step 758, the results of sensing step 756 are stored in the appropriate latches. At step 760, the flag is checked to determine if the page contains upper page data. If there is no flag, then any data present will be in the intermediate state B and Vrb was the incorrect comparison voltage to use. The process continues at step 762. At step 762, Vra is applied to the word line and the bit lines are re-sensed at step 764. At step 766, the result is stored. At step 768 (after either step 766, or step 760 if the flag is set), processor 212 determines a data value to be stored. In one embodiment, when reading the lower page, if the memory cell turns on in response to Vrb (or Vra) being applied to the word line, then the lower page data is "1." Otherwise, the lower page data is "0."

If it is determined that the page address corresponds to the upper page (step 750), an upper page read process is performed at step 752. In one embodiment, the upper page read process of step 752 includes the same method described in FIG. 18. FIG. 18 includes reading the flag and all three states since an unwritten upper page may be addressed for reading, or another reason.

In one embodiment, the process of FIG. 22 includes the application of $V_{READ}$ to the drain side neighboring word line. Therefore, $V_{READ}X=V_{READ}$ for the process of FIG. 22. In another embodiment of the process of FIG. 22, $V_{READ}X=V_{READ}LA(E)$.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
   a first non-volatile storage element;
   a second non-volatile storage element adjacent to said first non-volatile storage element;
   a bit line in communication with said first non-volatile storage element and said second non-volatile storage element;
   a set of data latches associated with said bit line; and
   managing circuitry in communication with said first non-volatile storage element, said second non-volatile storage element, said bit line and said set of data latches, said managing circuitry stores data from said second non-volatile storage element and a first indication in said set of data latches in response to a request to read said first non-volatile storage element, said managing circuitry performs a plurality of sense operations for a particular state to read said first non-volatile storage element, said managing circuitry replaces said data in said set of data latches with predetermined data for said particular state if said first non-volatile storage element is conductive during a particular one of said sense operations that corresponds to said data currently stored in said set of data latches and if said first indication is present in said set of data latches, said managing circuitry replaces said first indication with a second indication that said predetermined data is from said first non-volatile storage element if said data from said second non-volatile storage element is replaced.

2. The non-volatile memory system of claim 1, wherein said managing circuitry performs said plurality of sense operations for said particular state by:
   performing a first sense operation by applying a first read reference voltage to said first non-volatile storage element while applying a first pass voltage to said second non-volatile storage element, said first pass voltage corresponding to a first set of data that may be stored by said second non-volatile storage element; and
   performing a second sense operation by applying said first read reference voltage to said first non-volatile storage element while applying a second pass voltage to said second non-volatile storage element, said second pass voltage corresponding to a second set of data that may be stored by said second non-volatile storage element.

3. The non-volatile memory system of claim 2, wherein:
   said first sense operation compensates for an apparent increase in threshold voltage of said first non-volatile storage element if said second non-volatile storage element is programmed to a first state after programming said first non-volatile storage element; and
   said second sense operation compensates for an apparent increase in threshold voltage of said first non-volatile storage element if said second non-volatile storage element is programmed to a second state after programming said first non-volatile storage element.

4. The non-volatile memory system of claim 1, wherein:
   said first and second non-volatile storage elements are multi-level storage elements capable of being in one of eight data states;
   said different data that may be stored in said set of data latches includes eight individual sets of data corresponding to said eight data states; and
   said managing circuitry performs said plurality of sense operations by performing eight sense operations corresponding to said eight data states, each sense operation providing a different amount of compensation when sensing said first non-volatile storage element based on a potential data state of said second non-volatile storage element.

5. The non-volatile memory system of claim 4, wherein:
   said set of data latches comprises four data latches;
   said data from said second non-volatile storage element is stored in three data latches and said indication is stored in a single data latch;
   said managing circuitry replaces said data by overwriting said three data latches with said predetermined data; and
   said managing circuitry replaces said first indication with said second indication by overwriting said first indication stored in said single data latch.

6. The non-volatile memory system of claim 1, wherein said managing circuitry performs said plurality of sense operations for said particular state by:
   performing a first sense operation by applying a first read reference voltage to said first non-volatile storage element, said first read reference voltage corresponds to a first set of data that may be stored by said second non-volatile storage element; and
   performing a second sense operation by applying a second read reference voltage to said first non-volatile storage element, said second read reference voltage corresponds to a second set of data that may be stored by said second non-volatile storage element.

7. The non-volatile memory system of claim 1, wherein:
   said managing circuitry performs a plurality of sense operations for a different state to read said first non-volatile storage element, each sense operation for said different state corresponding to said different data that may be stored in said set of data latches for said second non-volatile storage element; and
   if said first non-volatile storage element is not conductive during said particular one of said sense operations for said particular state, said managing circuitry replaces said data from said second non-volatile storage element with different predetermined data if said first non-volatile storage element is conductive during a particular one of said sense operations for said different state that corresponds to said data currently stored in said set of data latches for said second non-volatile storage element.

8. The non-volatile memory system of claim 1, wherein said managing circuitry:

performs a plurality of sense operations for a different state to read said first non-volatile storage element, each sense operation for said different state is associated with said different data that may be stored in said set of data latches for said second non-volatile storage element;
determines that said first non-volatile storage element is conductive during a first sense operation of said plurality of sense operations for said different state;
determines that said set of data latches is storing said second indication; and
maintains said data from said second non-volatile storage element in said set of data latches in response to determining that said first non-volatile storage element is conductive and that said set of data latches is storing said second indication.

9. The non-volatile memory system of claim 1, wherein:
said first non-volatile storage element is conductive during a first of said sense operations when said first indication that said data is from said second non-volatile storage element is present, said first sense operation does not correspond to said data currently stored in said set of data latches; and
said managing circuitry maintains said data from said second non-volatile storage element in said set of data latches after said first sense operation.

10. The non-volatile memory system of claim 1, wherein:
said managing circuitry performs said plurality of sense operations for said particular state by applying a read reference voltage to said first non-volatile storage element that is between said particular state and a different state, said different state includes a higher range of threshold voltages than said particular state.

11. The non-volatile memory system of claim 1, wherein:
said managing circuitry performs said plurality of sense operations for said particular state by applying a plurality of read reference voltages to said first non-volatile storage element that are between said particular state and a different state, said different state includes a higher range of threshold voltages than said particular state.

12. The non-volatile memory system of claim 1, wherein:
said first non-volatile storage element is connected to a first word line;
said second non-volatile storage element is connected to a second word line; and
said indication that said data is from said second non-volatile storage element is an indication that said data is from said second word line.

13. The non-volatile memory system of claim 1, wherein:
said first and second non-volatile storage elements are first and second NAND flash memory cells.

14. A non-volatile memory system, comprising:
a first set of non-volatile storage elements in communication with a first word line;
a second set of non-volatile storage elements in communication with a second word line;
a plurality of bit lines, each in communication with a non-volatile storage element of said first set and a non-volatile storage element of said second set;
a plurality of sets of data latches, each set in communication with a bit line of said plurality; and
managing circuitry in communication with said first and said second word lines and said plurality of bit lines, said managing circuitry stores a set of data for each non-volatile storage element of said first set in a set of data latches for a corresponding bit line as part of a read operation for said second set, said managing circuitry reads said second set of non-volatile storage elements using a plurality of sense operations for a particular state, each sense operation for said particular state is associated with a potential set of data stored by said set of data latches for said non-volatile storage elements of said first set, said managing circuitry determines if a non-volatile storage element of said second set in communication with each bit line is conductive during a particular sense operation that is associated with said data stored in said set of data latches for said bit line, said managing circuitry overwrites said set of data with predetermined data corresponding to said particular state if said non-volatile storage element of said second set is conductive during said particular sense operation.

15. The non-volatile memory system of claim 14, wherein said managing circuitry reads said second set of non-volatile storage elements using said plurality of sense operations by:
applying a plurality of read reference voltages to said second word line, each read reference voltage is associated with a potential set of data stored by each of said set of data latches for said non-volatile storage elements of said first set.

16. The non-volatile memory system of claim 14, wherein said managing circuitry reads said second set of non-volatile storage elements using said plurality of sense operations, by:
applying a read reference voltage to said second word line; and
applying a plurality of pass voltages to said first word line while applying said read reference voltage, each pass voltage is associated with a potential set of data stored by each of said set of data latches for said non-volatile storage elements of said first set.

17. The non-volatile memory system of claim 16, wherein:
each pass voltage and each corresponding set of data is associated with a potential state to which said non-volatile storage elements of said first set may be programmed.

18. The non-volatile memory system of claim 17, wherein:
said non-volatile storage elements are multi-level memory cells that may be programmed to eight different states corresponding to eight different sets of data.

19. The non-volatile memory system of claim 14, wherein said managing circuitry stores a first value in said set of data latches for each bit line to indicate that said data is from said first word line prior to reading said second set of non-volatile storage elements.

20. The non-volatile memory system of claim 19, wherein said managing circuitry, for each bit line:
only overwrites said set of data for said non-volatile storage element of said first set when said first value is present in said set of data latches for said bit line; and
overwrites said first value with a second value when said predetermined data is written to said set of data latches for said bit line.

21. A non-volatile memory system, comprising:
a first set of non-volatile storage elements connected to a first word line, each in communication with a different bit line of a plurality of bit lines;
a second set of non-volatile storage elements connected to a second word line adjacent to said first word line, each in communication with a different bit line of said plurality of bit lines; and
managing circuitry in communication with said first and second plurality of non-volatile storage elements, said managing circuitry reads a first non-volatile storage element of said first set in response to a request to read a second non-volatile storage element of said second set, said first and second non-volatile storage elements are in communication with a first bit line, said managing circuitry stores data from said first non-volatile storage element and a first indication that said data is from said first non-volatile storage element in a set of data latches associated with said first bit line, said managing circuitry performs a plurality of sense operations corresponding to a particular state for said second non-volatile storage element, each sense operation is associated with a different set of data read from said second non-volatile storage element, said managing circuitry replaces said data in said set of data latches with predetermined data for said particular state if said second non-volatile storage element is conductive during a sense operation that is associated with said data currently stored in said set of data latches and said first indication is present, said managing circuitry replaces said first indication with a second indication that data for said second non-volatile storage element is stored in said set of data latches.

* * * * *